US011024650B2

United States Patent
Huang et al.

(10) Patent No.: US 11,024,650 B2
(45) Date of Patent: Jun. 1, 2021

(54) FINFET DEVICE AND A METHOD FOR FABRICATING THE SAME

(71) Applicant: Taiwan Semiconductor Manufacturing Company, Ltd., Hsinchu (TW)

(72) Inventors: Wang-Chun Huang, Hsinchu (TW); Kai-Chieh Yang, Tainan (TW); Ching-Wei Tsai, Hsinchu (TW); Kuan-Lun Chen, Hsinchu (TW); Chih-Hao Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/395,494

(22) Filed: Apr. 26, 2019

(65) Prior Publication Data

US 2020/0343273 A1    Oct. 29, 2020

(51) Int. Cl.
| H01L 27/12 | (2006.01) |
|---|---|
| H01L 29/78 | (2006.01) |
| H01L 29/06 | (2006.01) |
| H01L 29/26 | (2006.01) |
| H01L 29/24 | (2006.01) |
| H01L 29/16 | (2006.01) |
| H01L 21/02 | (2006.01) |
| H01L 21/8234 | (2006.01) |
| H01L 29/66 | (2006.01) |
| H01L 29/10 | (2006.01) |
| H01L 21/308 | (2006.01) |

(52) U.S. Cl.
CPC .... *H01L 27/1211* (2013.01); *H01L 21/02527* (2013.01); *H01L 21/3086* (2013.01); *H01L 21/823412* (2013.01); *H01L 21/823431* (2013.01); *H01L 21/823481* (2013.01); *H01L 29/0649* (2013.01); *H01L 29/1033* (2013.01); *H01L 29/1606* (2013.01); *H01L 29/24* (2013.01); *H01L 29/26* (2013.01); *H01L 29/66969* (2013.01); *H01L 29/785* (2013.01)

(58) Field of Classification Search
None
See application file for complete search history.

(56) References Cited

U.S. PATENT DOCUMENTS

| 7,300,837 B2 | 11/2007 | Chen et al. |
| 8,440,517 B2 | 5/2013 | Lin et al. |

(Continued)

*Primary Examiner* — Long Pham
(74) *Attorney, Agent, or Firm* — Finnegan, Henderson, Farabow, Garrett & Dunner, LLP.

(57) ABSTRACT

A finFET device that includes a substrate and at least one semiconductor fin extending from the substrate. The fin may include a plurality of wide portions comprising a first semiconductor material and one or more narrow portions. The one or more narrow portions have a second width less than the first width of the wide portions. Each of the one or more narrow portions separates two of the plurality of wide portions from one another such that the plurality of wide portions and the one or more narrow portions are arranged alternatingly in a substantially vertical direction that is substantially perpendicular with a surface of the substrate. The fin may also include a channel layer covering sidewalls of the plurality of wide portions and a sidewall of the one or more narrow portions.

18 Claims, 23 Drawing Sheets

(56) References Cited

U.S. PATENT DOCUMENTS

| | | |
|---|---|---|
| 8,703,565 B2 | 4/2014 | Chang et al. |
| 8,735,993 B2 | 5/2014 | Lo et al. |
| 2018/0083103 A1* | 3/2018 | Lee .................... H01L 29/0649 |
| 2018/0166457 A1* | 6/2018 | Colinge ................ H01L 29/775 |
| 2019/0267291 A1* | 8/2019 | Anderson ......... H01L 29/78642 |
| 2020/0052124 A1* | 2/2020 | Miao ...................... B82Y 10/00 |
| 2020/0058770 A1* | 2/2020 | Colinge ............ H01L 29/66545 |
| 2020/0075599 A1* | 3/2020 | Hashemi ............. H01L 27/1052 |
| 2020/0266298 A1* | 8/2020 | Cheng ................. H01L 29/0847 |

\* cited by examiner

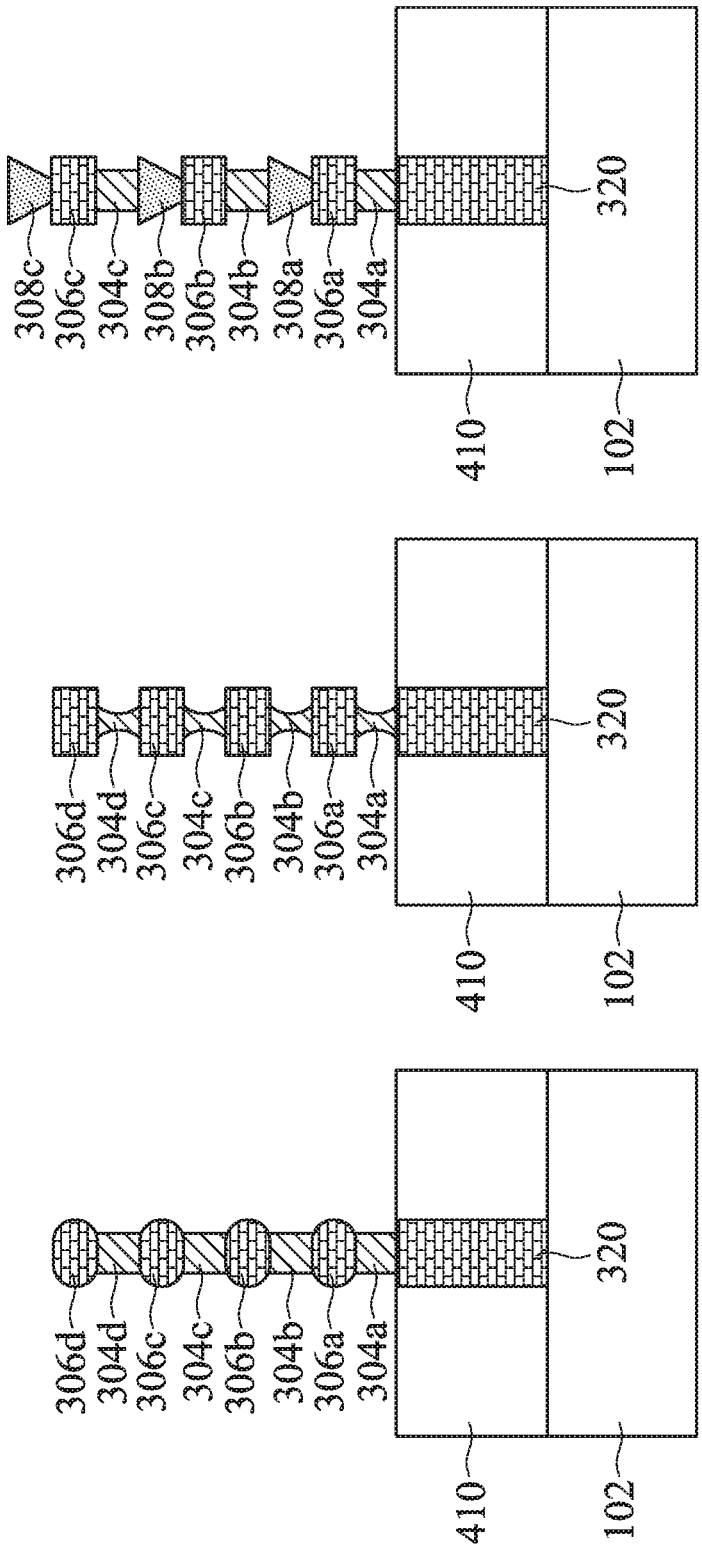

FINFET DEVICE AND A METHOD FOR FABRICATING THE SAME

TECHNICAL FIELD

The disclosure relates to a semiconductor device and method for manufacturing a semiconductor device, and more particularly to a semiconductor fin and a manufacturing method for a semiconductor fin.

BACKGROUND

Transistors are one of the major components of modern integrated circuits. The size of transistors has been continuously reduced in the past decades to satisfy the requirements of higher device density, improved performance, and lower costs. Today, transistors are fabricated with nanometer technology processes, and millions are packed in a single integrated circuit.

Challenges of fabricating transistors in nanometer nodes have been addressed with the development of three-dimensional designs, such as a fin field effect transistor (finFET). FinFET designs offer certain benefits over planar transistor designs. For example, forming the transistor channel on a vertical fin, extending perpendicularly relative to the substrate, the transistor's gate can wrap-around the channel and control the channel's conductivity from multiple sides. While finFET fabrication has the inherent complexities of working with three-dimensional structures, finFETs are frequently implemented for nanometer nodes because they may provide advantages under certain circumstances. Examples of certain advantages may include of reduced short channel effects, reduced leakage, and/or higher current flows. Moreover, finFET devices maximize use of chip area, allowing packing more transistors in the chip and reducing overall fabrication costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A-20C show cross-sections of semiconductor devices in accordance with other embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-13 show cross-section views of an exemplary sequential manufacturing process of a semiconductor device according to disclosed embodiments. It is understood that additional operations can be provided before, during, and after processes represented by FIGS. 1-13, and some of the operations described below can be replaced or eliminated. The order of the operations/processes may be interchangeable.

Figure 1:
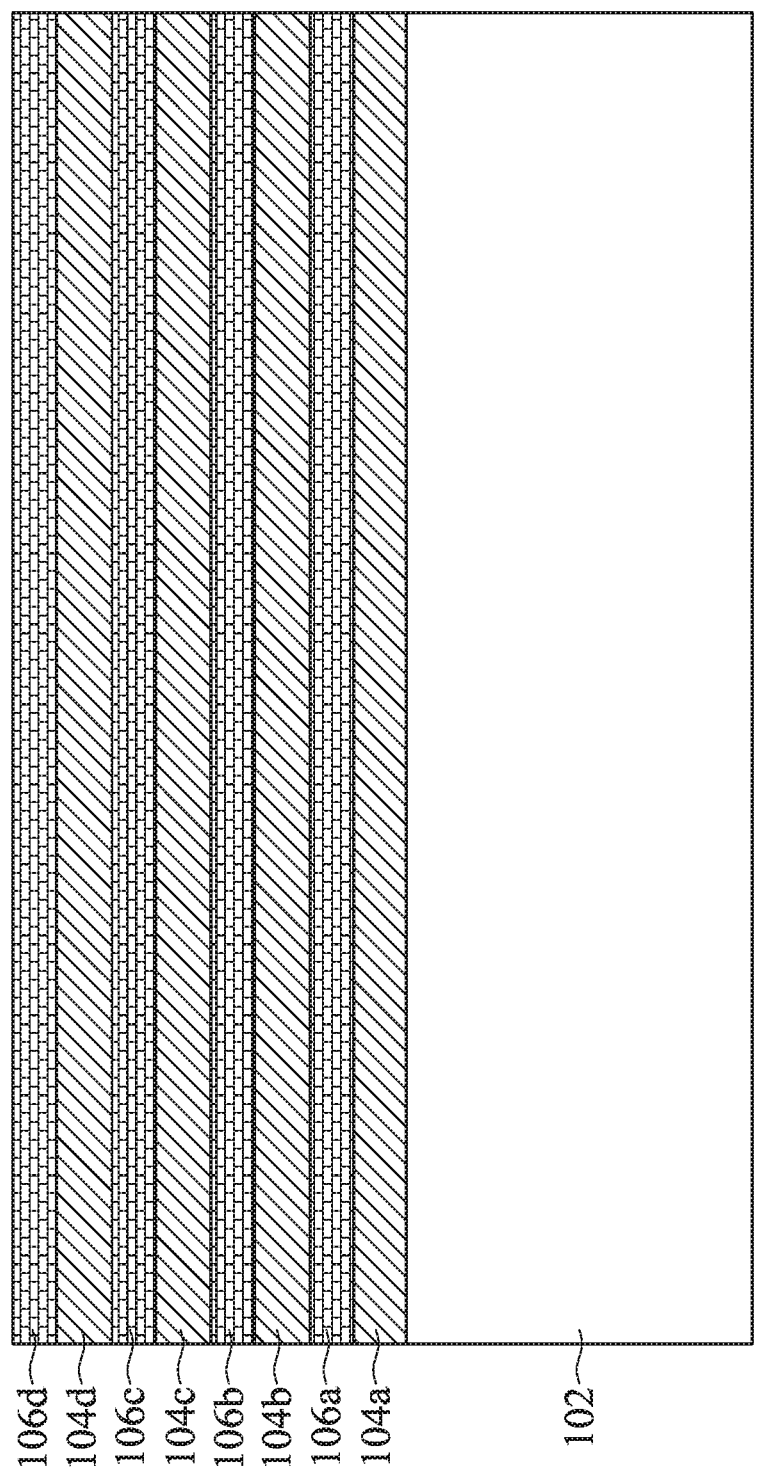
FIGS. 1-13 show cross-section views of an exemplary sequential manufacturing process of a semiconductor device in accordance with embodiments of the present disclosure.

FIG. 1 shows a cross-section of a semiconductor device after a plurality of semiconductor layers are formed over a substrate 102. In the depicted embodiment, substrate 102 may be a semiconductor substrate including silicon. Alternatively, or additionally, substrate 102 may include another elementary semiconductor, such as germanium; a compound semiconductor including silicon carbide, gallium arsenic, gallium phosphide, indium phosphide, indium arsenide, and/or indium antimonide; an alloy or composite semiconductor including SiGe, GaAsP, Alin As, AlGaAs, GanAs, GanP, and/or GanASP; or combinations thereof. Substrate 102 may be a semiconductor on insulator (SOI). Substrate 102 may include a doped epi layer, a gradient semiconductor layer, and/or a semiconductor layer overlying another semiconductor layer of a different type, such as a silicon layer on a silicon germanium layer.

Substrate 102 may be a p-type or an n-type substrate depending on design requirements of the integrated circuit device 100. For example, substrate 102 may be a p-type substrate including p-type dopants such as boron, gallium, indium, other suitable p-type dopants, or combinations thereof. In other embodiments, substrate 102 may include an n-type doped substrate including n-type dopants such as phosphorus, arsenic, other suitable n-type dopants, or combinations thereof. Alternatively, or additionally, substrate 102 may include various p-type doped regions and/or n-type doped regions. Doping may be implemented using a process such as ion implantation or diffusion in various steps and techniques.

Substrate 102 may have an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Impurities may include atoms of another element located either in place of one of the crystal's atoms or in spaces between crystal atoms in substrate 102. The impurity may be referred to as a dopant when the associated atoms are located in place of one of the substrate atoms. The impurity may be referred to as interstitial when the associated atoms are located between substrate crystal atoms. The impurity may have a valence that is different from the atoms that make up the bulk of the substrate. For example, silicon and germanium have a valence of 4; they have 4 electrons in their outer shell. For this reason each silicon atom has 4 nearest neighbors in the crystal and shares an electron with each. Arsenic, a dopant in silicon, has a valence of 5. If an arsenic atom replaces a silicon atom there will be an extra electron (i.e., a free electron) in the vicinity of the arsenic dopant.

As noted above, the semiconductor device in FIG. 1 includes a plurality of a device layers formed on substrate 102. The device layers include first semiconductor material layers 104 and second semiconductor material layers 106. While FIG. 1 shows four first semiconductor material layers 104 (i.e., 104a, 104b, 104c, and 104d) and four second semiconductor material layers 106 (i.e., 106a, 106b, 106c, and 106d), more or fewer first and second semiconductor material layers may be provided.

First semiconductor material layers 104 may be, for example Ge or $Si_{(1-x)}Ge_x$, where x is in a range of about 0.1 to about 0.9. In the present disclosure, $Si_{(1-x)}Ge_x$ may be simply referred to as SiGe. Additionally, or alternatively, first semiconductor material layers 104 may include other composite semiconductors. For example, first semiconductor material layers 104 may include an alloy semiconductor including SiGe, GaAsP, AlIn As, AlGaAs, GaNAs, GaNP, and/or GaNASP, or combinations thereof. First semiconductor material layers 104 may be formed using any of epitaxy growth, CVD processes, and/or other suitable methods.

In some embodiments, as shown in FIG. 1, first semiconductor material layers 104 may be formed with a different material from substrate 102. For example, while substrate 102 may be a Si substrate, first semiconductor material layers 104 may be SiGe layers. Moreover, in some embodiments, each of first semiconductor material layers 104 may have a uniform thickness between about 5 nm and 100 nm. For example, each of first semiconductor layers 104a-104d may be epitaxially grown to a thickness of about 8 nm. However, in other embodiments, any or all of first semiconductor material layers 104 may have different thicknesses. First semiconductor layer 104a may be thicker than first semiconductor layer 104b, which may in turn be thicker than first semiconductor layer 104c, which may also be thicker than first semiconductor layer 104d. Alternatively, each of first semiconductor material layers 104 may have a thickness that is not related to other first semiconductor layers in any particular pattern. In certain embodiments, the thickness of first semiconductor layers is in a range of about 5 nm to about 15 nm.

Second semiconductor material layers 106 may be, for example, Si or $Si_{(1-y)}Ge_y$, where y<1. Alternatively, or additionally, second semiconductor material layers 106 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Second semiconductor material layers 106 may be formed using any of epitaxy growth, CVD processes, and/or other suitable methods.

In some embodiments, as shown in FIG. 1, second semiconductor material layers 106 may be formed with the same material as substrate 102. For example, both substrate 102 and second semiconductor material layers 106 may be Si. However, in other embodiments, second semiconductor material layers 106 may be formed with a different material from substrate 102.

Each of second semiconductor material layers 106 may have a uniform thickness between about 5 nm and 100 nm. For example, each of second semiconductor material layers 106a-106d may be epitaxially grown to a thickness of about 15 nm. However, in other embodiments, each of second semiconductor material layers 106 may have a different thickness. For example, second semiconductor layer 106a may be thicker than second semiconductor layer 106b, which may in turn be thicker than second semiconductor layer 106c, which may also be thicker than second semiconductor layer 106d. In certain embodiments, the thickness of second semiconductor material layers 106 is in a range of about 10 nm to about 15 nm. In other embodiments, the thickness of second semiconductor material layers 106 may be related to the thickness of the first semiconductor material layers 104. For example, the thickness of second semiconductor material layers 106 may be about half the thickness of first semiconductor material layers 104. Alternatively, the thickness ratio between first semiconductor layers and second semiconductor material layers 106 may be any of 1:2, 2:3, 3:5, or 5:7. Moreover, in other embodiments, the thickness of second semiconductor material layers 106 may be substantially the same than the thickness of first semiconductor material layers 104 and have variations between +/−10%.

As shown in FIG. 1, the material used for first semiconductor material layers 104 is different than the material selected for second semiconductor material layers 106. The different materials may be selected so they have different etch rates when exposed to an etchant. For example, while the material selected for first semiconductor material layers 104 may etch quickly in the presence of a given etchant, such as a fluorine gas, the material selected for second semiconductor material layers 106 may be selected so it does not etch (or does not appreciably etch or etch as much as layer 104) in the presence of the fluorine gas. Other differences between etch rates of the first semiconductor material layers 104 and second semiconductor material layers 106 are also possible. For example, the etch rate of the first semiconductor material layers 104 and the etch rate of the second semiconductor material layers 106 may have a ratio between 2:1 and 100:1. For example, the ratio between etch rates may be between 3:1 and 10:1, or between 2:1 and 10:1. As it will be explained in connection with FIG. 5, the difference in etch rates between layers allows the formation of devices with greater surface area and ultimately a greater effective width for the transistors. Thus, first semiconductor material layers 104 and second semiconductor material layers 106 can be selected based on differences in their etch rates.

In some embodiments, as shown in FIG. 1, first semiconductor material layers 104 and second semiconductor material layers 106 are alternatively formed on substrate 102. Thus, forming one of first semiconductor material layers 104 is followed by forming one of second semiconductor material layers 106 to form an alternating stack in a vertical direction extending from substrate 102 (e.g., in a direction normal to a surface of substrate 102). As noted above, while FIG. 1 shows the result of four iterations of device layer formation, the process(es) may be repeated as many times as desired. For example, the device layer formation process may proceed until a desired height of fins (to be later formed from the deposited device layers) is achieved. That is, the height of the fins in the device is related to the number of first semiconductor material layers 104 and second semiconductor material layers 106 that are formed.

Additional processes may be employed during formation of the first and second semiconductor material layers 104 and 106. For example, the layers may be annealed (e.g., between layer formation processes or after all layers 104 and 106 have been deposited). Such annealing may for example, densify deposited films, change states of grown films, repair damage resulting from deposition, move dopants or drive dopants from one film into another, etc. In one example, after formation of each layer, the layers may be subjected to rapid thermal anneal and/or rapid thermal processing. Alternatively, or additionally, anneal processes may be performed after a group of layers is formed. For example, annealing may be performed after formation of a group of layers including a pair of first semiconductor material layers 104 separated by a second semiconductor material layer 106. Alternatively, annealing may be performed after formation of a group of layers including a pair of second semiconductor material layers 106 separated by a first semiconductor material layer 104, or after formation of any group of semiconductor material layers.

Figure 2:
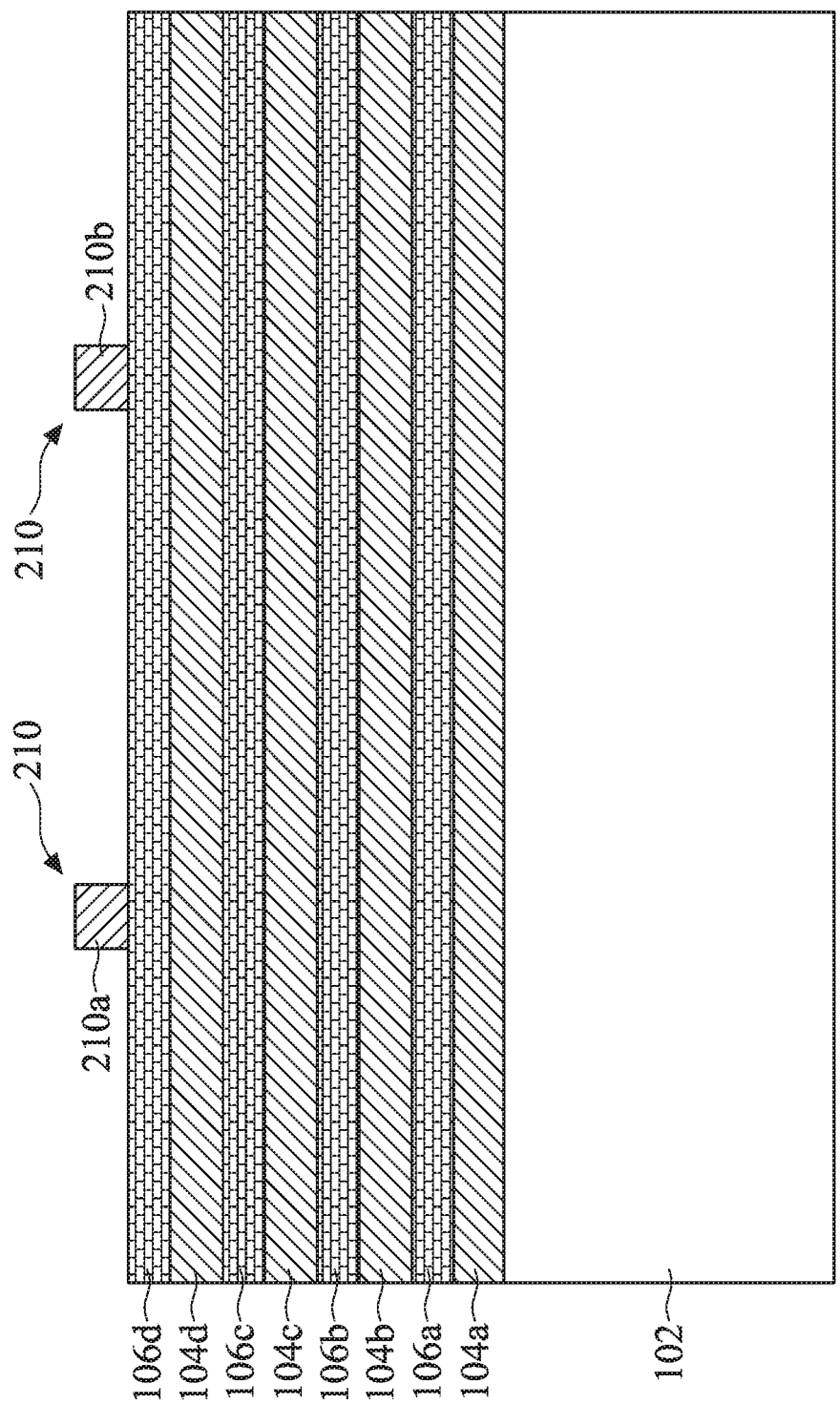

As shown in FIG. 2, after forming the device layers, a mask layer 210 may be formed over the device layers. Mask layer 210 may be formed on the upper-most device layer. For example, mask layer 210 may be formed on second semiconductor layer 106d.

In the depicted embodiment, mask layer 210 may be formed by forming and patterning a dielectric material such as silicon dioxide. In other embodiments, mask layer 210 may be formed by depositing and patterning silicon nitride, silicon oxynitride, TEOS oxide, phosphosilicate glass (PSG), borophosphosilicate glass (BPSG), fluorinated silica glass (FSG), carbon doped silicon oxide, Xerogel, Aerogel, amorphous fluorinated carbon, Parylene, BCB (bis-benzocyclobutenes), polyimide, other suitable materials, or combinations thereof. In some embodiments, mask layer 210 may have a multilayer structure. Moreover, mask layer 210 may be formed by a technique including spin-on coating, CVD, sputtering, or other suitable processes.

Patterning mask layer 210 may include applying a photoresist layer, performing photolithography to form openings in the photoresist, and etching regions of mask layer 210 through the formed openings. An exemplary patterning process includes soft baking of the photoresist layer, mask aligning, exposure, post-exposure baking, developing the photoresist layer 702, rinsing, and drying (e.g., hard baking). Once the photoresist layer is patterned, the etching process of mask layer 210 may use a selective etchant. For example, when mask layer 210 is formed with silicon dioxide, the etchant used to pattern mask layer 210 may be an etchant highly selective to silicon dioxide, such as buffered oxide etch. As shown in FIG. 2, in some embodiments patterning mask layer 210 may result in multiple masked regions such as masked region 210a and masked region 210b.

Mask layer 210 may have a thickness of about 5 nm to about 120 nm. In other embodiments, mask layer 210 may have a thickness similar to or substantially equal to the thickness of first semiconductor material layers 104 and/or second semiconductor material layers 106.

Figure 3:
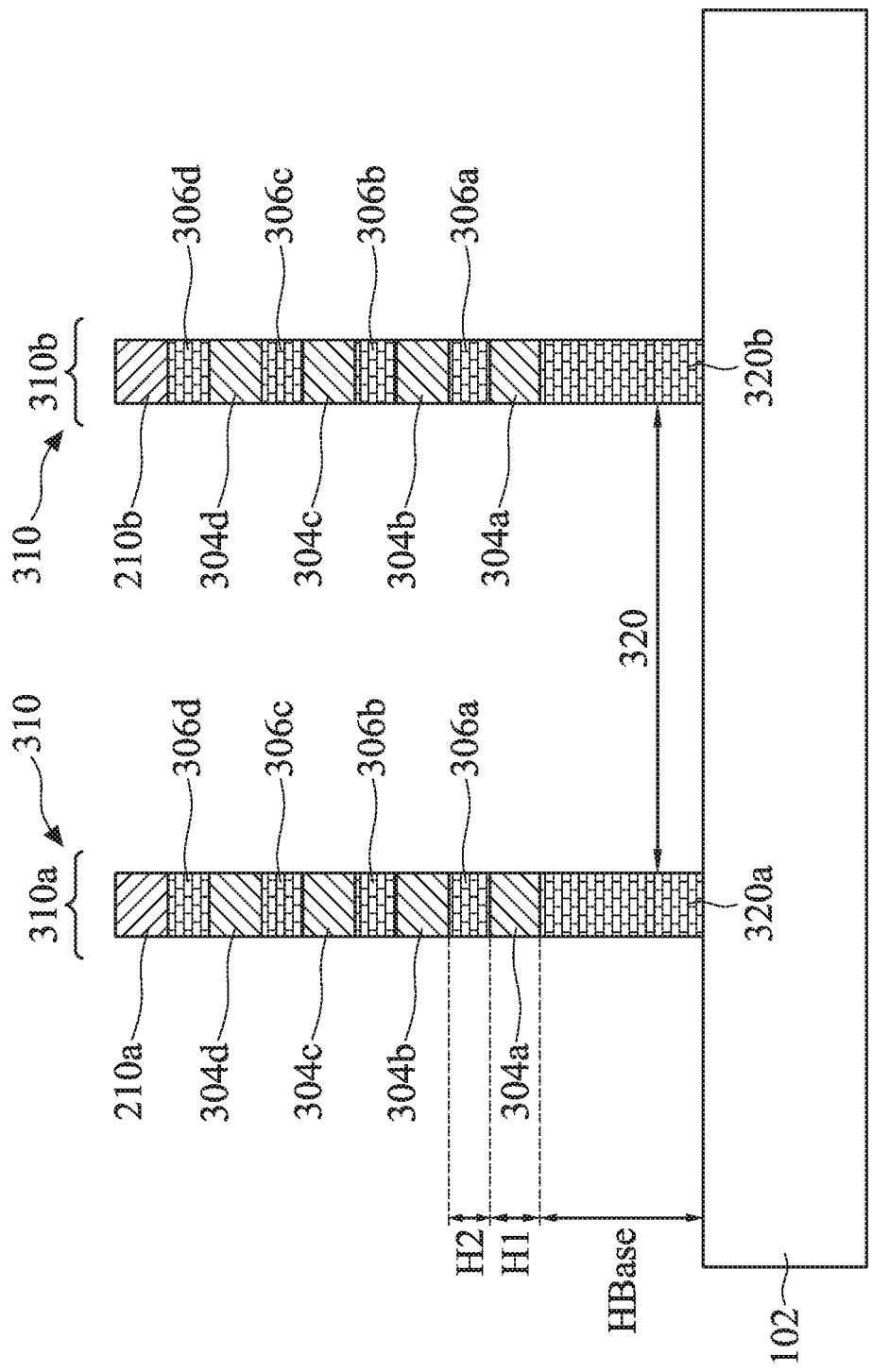

As shown in FIG. 3, after forming mask layer 210, device layers may be etched in regions not protected by mask layer 210. First semiconductor material layers 104 and second semiconductor material layers 106 may be etched with anisotropic etch processes, such as RIE and/or deep RIE, to form fins 310 extending in a perpendicular direction relative to substrate 102. In some embodiments, etching to form fins 310 may include multiple etching steps with different etching chemistries, each targeting different layers deposited on substrate 102. For example, etching may include one chemistry to etch first semiconductor material layers 104 and a second chemistry to etch second semiconductor material layers 106. The resulting fins 310 are formed by alternating portions of first semiconductor material portions 304 and second semiconductor material portions 306. In some embodiments, as shown in FIG. 3 a first fin 310a results from etching relative to masked region 210a and a second fin 310b results from etching relative to masked region 210b. In such embodiments, etching of device layers results in the formation of at least a pair of fins 310, including fin 310a and fin 310b.

In some embodiments, as shown in FIG. 3, etching of the device layers may also include partially etching substrate 102 to form base portions 320. For example, substrate 102 may be recessed to a selected depth that may be between about 10 nm and about 500 nm. In such embodiments, fins 310 may include base portion 320, which extend from a surface (e.g., an etched recessed surface) of substrate 102. Atop the base portions, fins 310 include the alternating layers of first semiconductor material portions 304 (e.g., 304a-d) and second semiconductor material portions 306 (e.g., 306a-d).

The different thicknesses of first semiconductor material layers 104 and semiconductor material layers 106 may result in similar thickness relationships among first semiconductor material portions 304 and second semiconductor material portions 306 after etching to form fins 310. For example, first semiconductor material portions 304 may have heights less than any or all of second semiconductor material portions 306 (e.g., resulting from differences in thicknesses between first semiconductor material layers 104 and semiconductor material layers 106). Alternatively, second semiconductor material portions 306 may have heights less than any or all of first semiconductor material portions 304.

Base portions 320 may have various height relationships with respect to the first and/or second semiconductor material portions. For example, in one embodiment, base portions 320 may have a height greater that heights of both the first semiconductor material portions 304 and the second semiconductor material portions 306 In some embodiments, the following relationship may apply to heights of the base portions, first semiconductor material portions, and second semiconductor material included in fins 310: HBase>H1>H2, where HBase refers to the height of base portions 320, H1 refers to the height of first semiconductor material portions 304, and H2 refers to the height of second semiconductor material portions 306. Moreover, alternative height relationships are also possible based on the application, type of selecting trim, and deposition techniques. For example, in some embodiments, HBase=H1=H2. In other embodiments, HBase>H1=H2. In yet other embodiments, HBase>H1<H2.

Figure 4A:
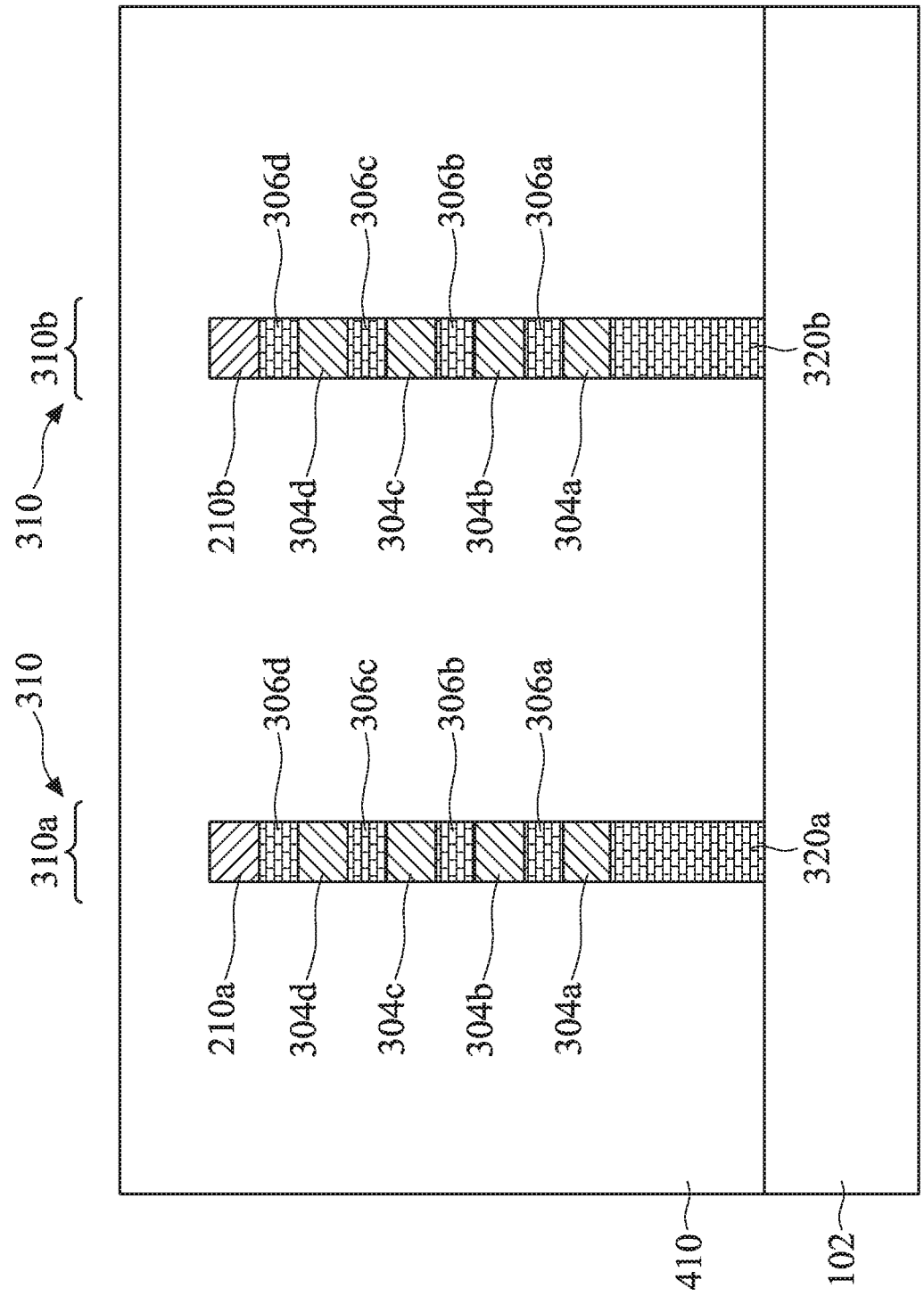

After forming fins 310, as shown in FIG. 4A, a dielectric material may be formed on substrate 102. In some embodiments, the dielectric material may be formed as a conformal thick dielectric layer, thick enough to cover up fins 310. The dielectric layer may then be processed to create shallow trench isolations (STI) regions 410. STI regions 410 may be formed of silicon oxide, silicon nitride, silicon oxynitride, fluoride-doped silicate glass (FSG), a low-k dielectric material, and/or other suitable insulating material. For example, STI regions 410 may be made of silicon oxide formed via CVD on substrate 102 and on fins 310. Alternatively, or additionally, STI regions 410 may be formed with one or more of sub-atmospheric chemical vapor deposition (SA-CVD), high-density plasma chemical vapor deposition (HDP-CVD), or spin on (with spin-on glass (SOG)). While FIG. 4 shows STI regions 410 isolating fins 310, other forms of isolation structures or techniques between fins 310 may also be employed. For example, fins 310 may be isolated with LOCOS or any other suitable isolation structure.

Figure 4B:
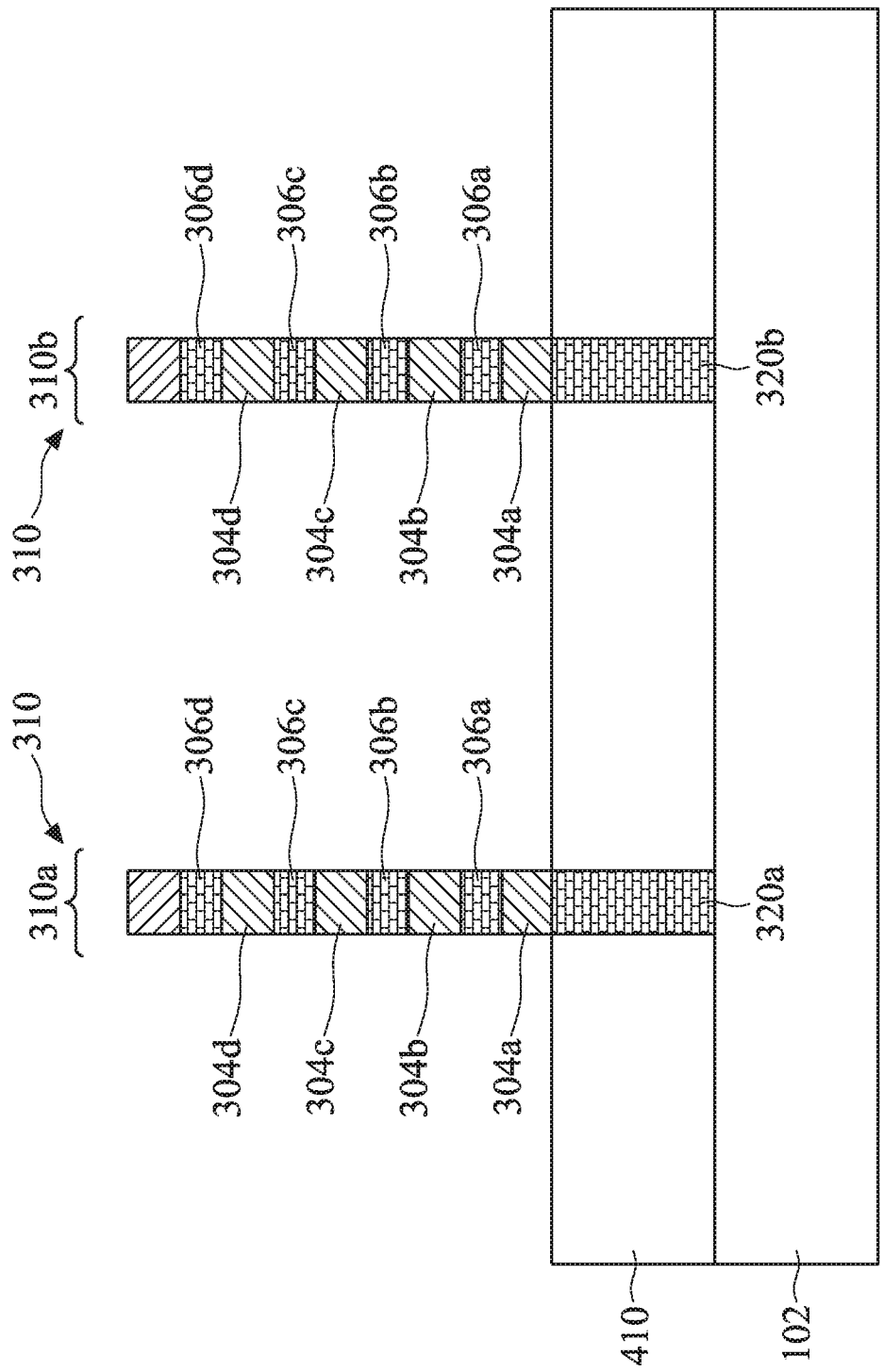

After forming the dielectric material as shown in FIG. 4A, a chemical mechanical polish (CMP) may be performed to planarize the surface of the wafer. In some embodiments, mask layer 210 may be used as a CMP stop layer. The formed and planarized dielectric material may then be partially etched or recessed, as shown in FIG. 4B, to form shallow trench isolation (STI) regions 410. For example, in embodiments in which STI regions 410 are formed of oxide, STI regions 410 may be formed with an etching process selective to oxide after the CMP. Other fabrication techniques for STI regions 410 are possible. Moreover, STI regions 410 may include a multi-layer structure, for example, having one or more liner layers.

In some embodiments, as shown in FIG. 4, the dielectric material may be etched or recessed so STI regions 410 cover at least a portion of sidewalls of base portions 320. In the embodiment of FIG. 4, the dielectric of STI regions 410 does not cover sidewalls of first semiconductor material portions 304 or sidewalls of second semiconductor material portions 306. In other embodiments, however, the dielectric of STI regions 410 may be recessed in a manner such that STI regions 410 at least partially cover sidewalls of base portions 320 and/or any of the semiconductor portions 304/306.

Figure 5:
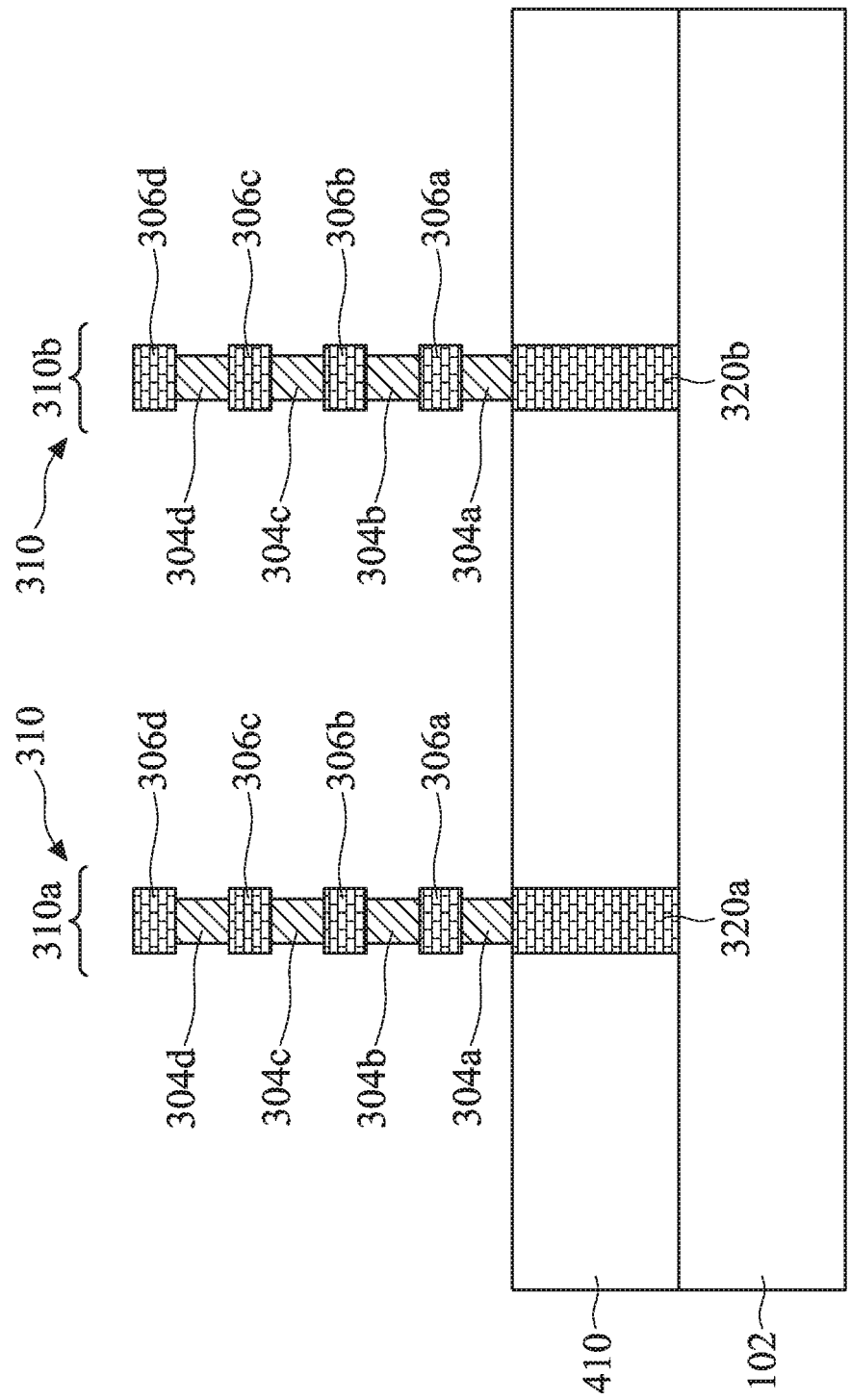

As shown in FIG. 5, once fins 310 are formed, portions of fins 310 are selectively etched. For example, first semiconductor material portions 304 may be selectively etched so first semiconductor material portions 304 become narrower than second semiconductor portions 306, resulting in fins 310 having a cross section with an 'I' structure. Such fins may include cross-sections having wide portions (e.g., 306a-d) alternated with narrow portions (e.g., 304a-d). In the example embodiment of FIG. 5, the plurality of first (or narrow) portions (304a-d), narrowed by the selective trim, are arranged alternatingly with the second (or wide) portions (306a-d) in a substantially vertical direction that is substantially perpendicular with a surface of the substrate. In other embodiments, portions 304a-d may be wider than portions 306a-d (e.g., if portions 306a-d are selectively etched at a rate greater than an etch rate associated with portions 304a-d). Alternatively, or additionally, instead of having 'I' shaped cross-sections, other cross-section shapes are also possible by, for example, using anisotropic etchants that only etch one crystalline direction of either first semiconductor material portions 304 or second semiconductor material portions 306.

As shown in FIG. 5, after the selective trim, fins 310 include a stack of alternating first semiconductor material portions 304 and second semiconductor material portions 306 with different widths and/or profiles. Each of the portions may have different width based on its etch rate relative to certain chemistries. Alternatively, or additionally, each of the portions of fins 310 may have a different slope and/or sidewall profile relative to one or more other fin portions.

Indeed, the materials used for first semiconductor material layers 104 and second semiconductor material layers 106 may be selected based on the availability of selective etchants that primarily etch one of the layers but etch another layer at a slower rate or not at all. For example, semiconductor materials used for first semiconductor material layers 104 and second semiconductor material layers 106 may be selected based on the availability of an etchant that etches first semiconductor material portions 304 at a higher etch rate than second semiconductor material portions 306.

In some embodiments first semiconductor material portions 304 are formed with SiGe, and second semiconductor material portions 306 are formed with Si. In such embodiments, released fins 310 may be exposed to an etchant selective to SiGe, such as TMAH, to partially etch first semiconductor material portions 304 without significantly etching second semiconductor material layers 106. This selective etch or selective trim of some layers in fins 310 may result in the 'I' structure referenced above with alternating narrow and wide portions.

The selective trim or etch may be performed using dry etching, wet etching, or combined processes. For example, the selective trim may be performed by timed exposure of fins 310 to a wet etchant, such as HCl. Alternatively, or additionally, the selective etch may be performed with an isotropic dry etching process that is selective to one of the layers. In some embodiments, the selective etch may be performed with a combination of dry and wet etch. For example, the selective etch may include a first phase of dry etch and a second phase of wet etch. Moreover, the selective etch may include etching with a combination of anisotropic etchants including one or more of potassium hydroxide, ethylene diamine, pyrocatechol, and/or tetramethylammonium hydroxide.

The selective trim may be timed so the widths of first semiconductor material portions 304 have a desired ratio with respect to widths of the second semiconductor material portions 306. For example, in embodiments in which first semiconductor material portions 304 are the narrow portions and second semiconductor material portions 306 are the wide portions, the selective trim may be timed so the width of narrow portions is less than 0.5× the width of wide portions or so the wide portions are at least 1.5× wider than the narrow portions. Alternatively, the selective trim may be performed so the width of narrow portions is less than 75% the width of wide portions. For example, in some embodiments, the initial width of fins 310, as determined by mask layer 210, may be about 5 nm to about 50 nm. In such embodiments, after the selective trim, second semiconductor material portions 306 may have a width between 5 nm-50 nm, while first semiconductor material portions 304 may have a width between 3 nm-30 nm. In some cases, the selective trim may be timed so the width of narrow portions and the width of wide portions have a ratio between 1:1.2 to 1:5.

In the example embodiment of FIG. 5, all of the second semiconductor material portions 306 share substantially the same width, and all of first semiconductor material portions 304 share substantially the same width (e.g., narrower than the width of second portions 306). However, in other embodiments, widths of each portion may be different. For example, widths of some or all of the first portions 304 may be different from one another, widths of some or all of the second portions 306 may be different from one another, and any or all of the first portions 304 may have widths different from any or all of the second portions 306.

In some cases, as noted above, the width profile of the first and second portions, e.g., may result in cross sectional 'I' shapes. In some embodiments, if the nine portions of the fins 310 shown in FIG. 5 are counted from bottom to top, first portions (base portions 320) may have a first width, first semiconductor material portion 304a, on base portion 320a, may have a second width smaller than the first width; second semiconductor material portion 306a on the first semiconductor material portion 304a may have a third width larger than the second width; first semiconductor material portion 304b on second semiconductor material portion 306a may have a fourth width smaller than the third width; second semiconductor material portion 306b on first semiconductor material portion 304b may have a fifth width larger than the fourth width; first semiconductor material portion 304c on second semiconductor material portion 306b may have a sixth width smaller than the fifth width; second semiconductor material portion 306c on first semiconductor material portion 304c; may have a seventh width and comprising larger than the sixth width; first semiconductor material portion 304d on second semiconductor material portion 306c may have an eighth width smaller than the seventh width; and second semiconductor material portion 306d on the first semiconductor material portion 304d may have a ninth width smaller than the eighth width.

While the embodiments described above include fins having 'I' shaped cross-sections, fins having cross-sections of any other shape (whether regular or irregular) may also be used. Such fins may be formed, for example, with the anisotropic etching techniques referenced above. With such arrangements, fins 310 may have increased peripheries, which can enhance device operation by increasing fins 310 periphery. Fins 310 with larger periphery may enable fabrication of transistor channels with a larger effective width, which may boost current driving capabilities and improve device performance. Further, in embodiments in which base portions 320 are made of the same material as second semiconductor material portions 306, base portions 320 may have a width substantially the same as the width of second semiconductor material portions 306.

FIG. 5 provides a cross-sectional view of one embodiment of the raised fins, according to one exemplary embodiment. Other structures and configurations of the raised fins, however, can be used. In the example of FIG. 5, raised fin 320a, similar to raised fin 320b, includes at least four wide portions 306a-d. This example also includes four narrow portions 304a-d. As shown, one or more of the narrow portions separate adjacent wide portions from one another. Base portion 320a may constitute a wide portion if it has a width greater than a width of any of narrow portions 304a-d. In some embodiments, the number of wide portions may be equal to or greater than the number of narrow portions. In other cases, the number of wide portions may be less than the number of narrow portions.

Figure 6:
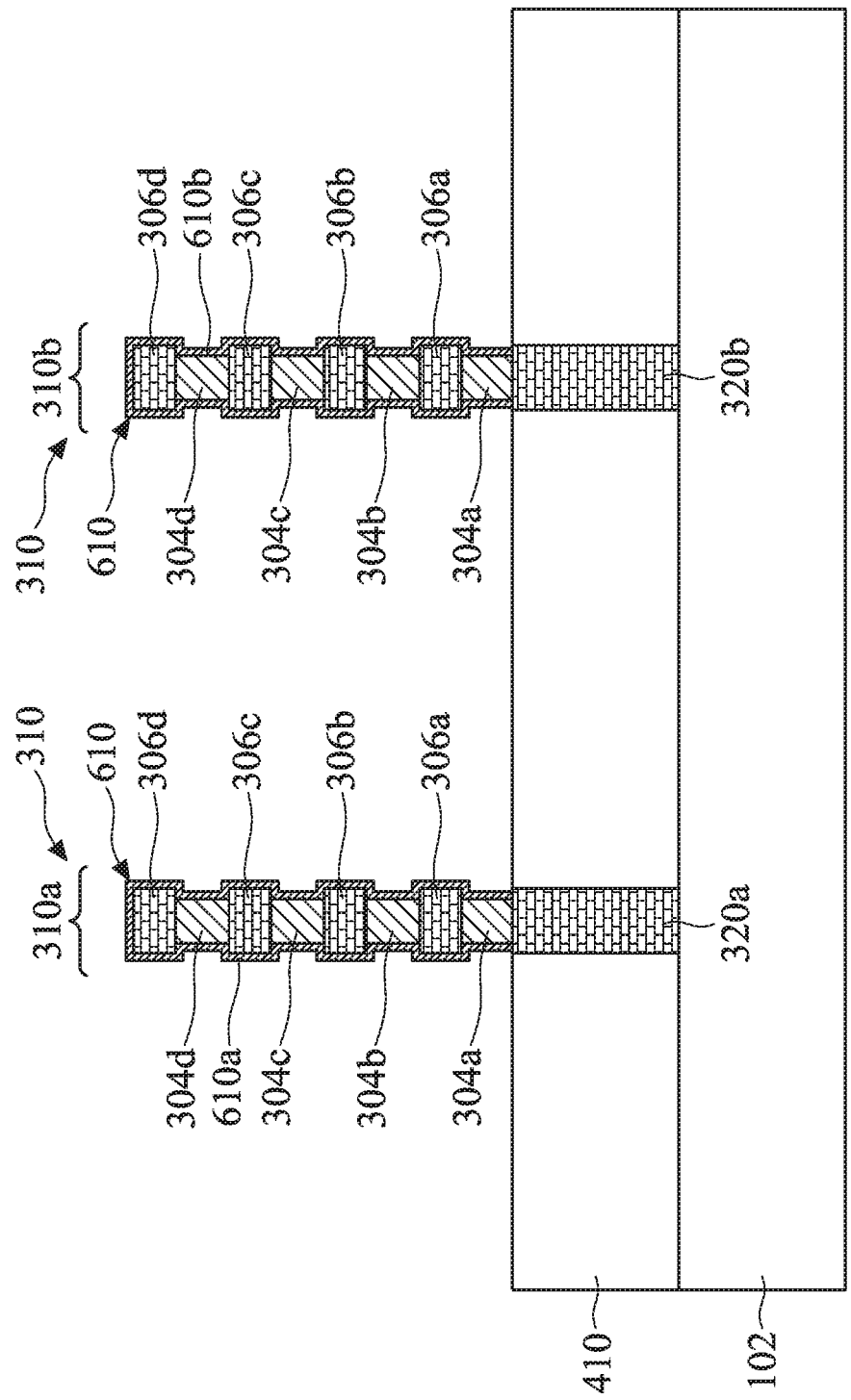

After the selective etch or trim, as shown in FIG. 6, a dielectric layer 610 may be formed to cover fins 310. Dielectric layer 610 may be formed to reduce or eliminate leak currents from fins 310 to other elements of the semiconductor device.

Dielectric layer 610 may be formed by any suitable process. In one embodiment, dielectric layer 610 may be formed by oxidizing fins 310 after the selective trim. In some embodiments, fins 310 may be oxidized with thermal oxidation to generate a dielectric layer 610. In such embodiments, dielectric layer 610 may include a plurality of regions with different materials. For example, in cases where first semiconductor material portions 304 include SiGe and second semiconductor material portions 306 include Si, dielectric layer 610 may include both SiOx and SiGeOx regions.

In other embodiments, however, dielectric layer 610 may be conformally deposited on fins 310. For example, dielectric layer 610 may be formed with chemical oxidation, atomic layer deposition (ALD), chemical vapor deposition (CVD), and/or other suitable formation process. In such embodiments, dielectric layer 610 may include silicon oxide based materials, such as silicon dioxide ($SiO_2$) and/or SiON, nitride based materials, such as silicon nitride, or combinations thereof. Alternatively, or additionally, dielectric layer 610 may include one or more layers of high-k oxides.

In some embodiments, dielectric layer 610 may have a thickness between 0.1 nm and 100 nm. In other embodiments, dielectric layer 610 may have a thickness that is related to the width of fins 310. For example, dielectric layer 610 may be formed to be less than $1/10^{th}$ of the thickness of first semiconductor material portions 304 or second semiconductor material portions 306. In other embodiments, the thickness of dielectric layer 610 may be based on the expected current that will be driven by the finFET. For example, if the finFET is designed for high current applications, dielectric layer 610 may be formed with a thickness of at least 50 nm. However, if the finFET is designed for low current applications the dielectric layer 610 may be formed with a thickness of less than 1 nm. Indeed, in some embodiments dielectric layer 610 may not be formed. Alternatively, in other embodiments, both semiconductor material portions 304 and second semiconductor material portions 306 may be fully oxidized to form dielectric layer 610.

Figure 7:
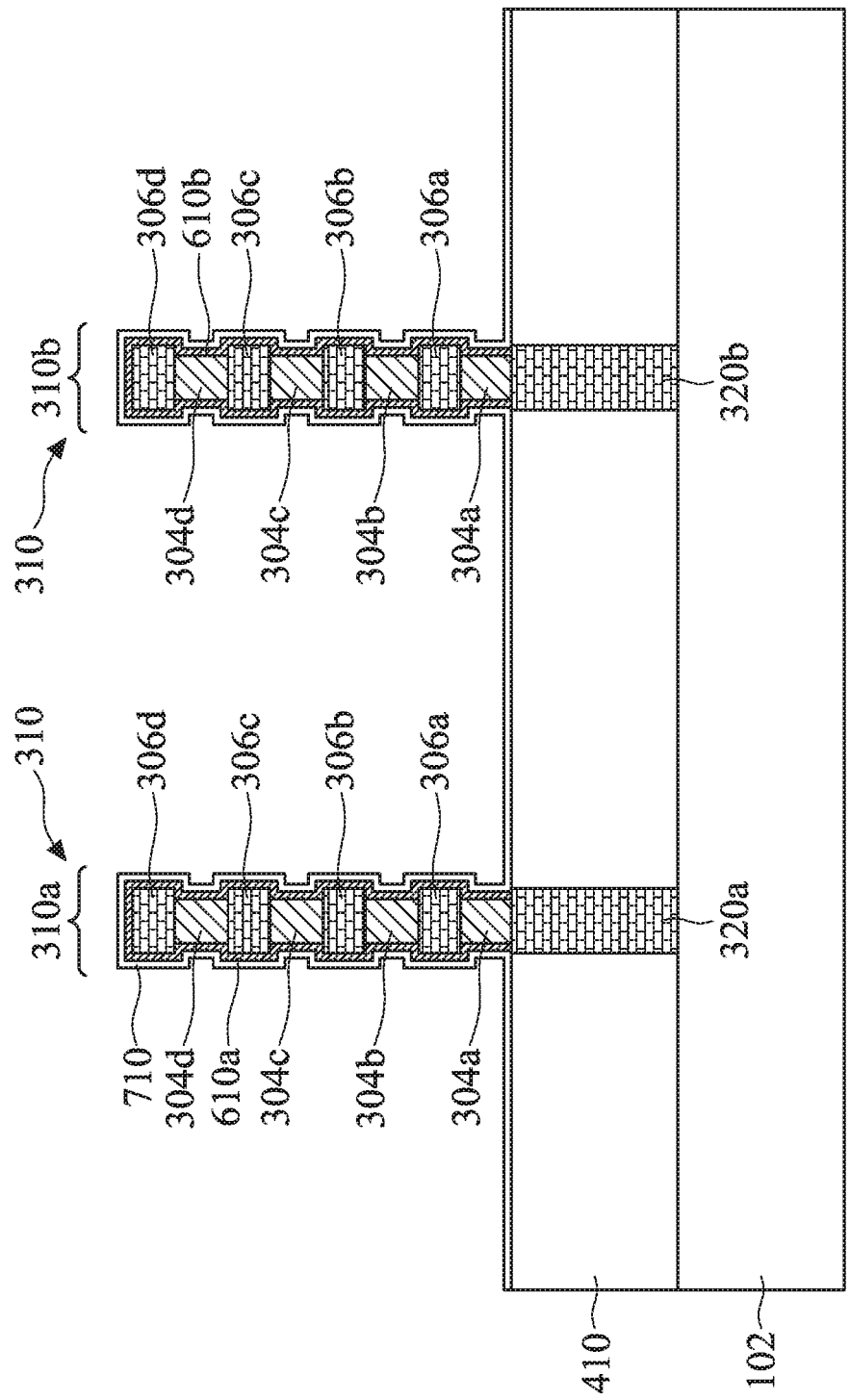

As shown in FIG. 7, a channel layer 710 may be conformally formed to cover fins 310 and STI regions 410 on substrate 102. In this disclosure, covering may refer to both placing a layer directly on a surface, or placing a layer over a substrate or other layer but having intervening layers between the surface of the substrate or other layer and the covering layer. For example, channel layer 710 covering fins 310 may be formed in direct contact with surfaces of fins 310. In other cases, channel layer 710 covering fins 310 may be formed on an intervening layer, such as dielectric layer 610, between the surfaces of fins 310 and channel layer 710.

Channel layer 710 may be deposited, transferred, and/or synthesized to conformally cover fins 310. Channel layer 710 may have sufficient carrier mobility to serve as a channel region even when formed having a relatively small cross-sectional area. In that regard, channel layer 710 may be a little as a single molecule in thickness. For example, in some embodiments, channel layer 710 includes one or more monolayers of molybdenum disulfate ($MoS_2$). Even in this configuration, $MoS_2$ may have a high enough mobility to enable the generation of a conduction channel. Moreover, in such embodiments, $MoS_2$ may be formed with impurities to manipulate carrier mobility in different regions of channel layer 710.

In some embodiments, channel layer 710 may include epitaxially grown layers. In such embodiments, a seed layer may be used to promote the epitaxial growth of channel layer 710 on fins 310. In other embodiments, channel layer 710 may be formed using ALD and/or CVD directly on fins 310. Alternatively, channel layer 710 may be transferred from a separate backing material. In such embodiments, channel layer 710 may be formed on the backing material, which can then be adhered to fins 310, allowing the backing to be removed while leaving the channel layer 710. In some embodiments, channel layer 710 may be formed by reacting two or more films and performing anneals to generate the channel layer 710 as a byproduct of the anneal reaction. In yet another exemplary embodiment, channel layer 710 may be deposited using an aqueous solution that includes channel layer 710. In some embodiments, channel layer 710 may be formed to have a standard thickness between 0.1 nm and 10 nm. However, in other embodiments, the thickness of channel layer 710 may depend on the thickness of monolayers used as channel layer 710. In yet other embodiments, the thickness of channel layer 710 may depend on the desire application of the transistor. For example, for high power applications, channel layer 710 may be selected to be thick to minimize resistance. However, in applications in which device density is prioritized, channel layer 710 may be ultra-thin and have a thickness of only a single monolayer (two-dimensional material) or a few mono-layers.

To control mobility and to produce a semiconductor-like response to a gate voltage, channel layer 710 may be doped by adding impurities. In some embodiments dopants, such as boron (B) and nitrogen (N), may be introduced in a matrix of channel layer 710 by performing atomic substitution. Additionally, or alternatively, the regular structure of the channel layer 710 may be disrupted by adding dopants such as titanium, chromium, iron, $NH_3$, potassium, and $NO_2$ in order to produce a desired bandgap. Other dopants, including organic dopants, may be included as part of channel layer 710 to modify the conductivity and electric field response of channel layer 710.

As mentioned above, channel layer 710 may be formed with one or more layers of $MoS_2$. In addition to, or as a substitute for $MoS_2$, in some embodiments, the channel layer 710 may include graphene. Alternatively, or additionally, channel layer 710 may include one or more layers of a transition metal dichalcogenide. For example, channel layer 710 may include a transition metal dichalcogenides, such as Zr, Ta, Nb, W, Mo, Ga, Sn, and a chalcogenide, such as, Se, S, Te. In further exemplary embodiments, channel layer 710 may include $ZrSe_2$, $TaSe_2$, $TaS_2$, $NbSe_2$, $WSe_2$, $MoTe_2$, $MoSe_2$, GaSe, GaS, $SnSe_2$, $SnS_2$ and/or other transition metal dichalcogenides. In various embodiments, transition metal dichalcogenide material of the channel layer 710 may be deposited using molecular beam epitaxy (MBE), CVD, and/or other suitable depositions processes. In yet other embodiments, channel layer 710 may be formed with suitable thin-film semiconductor materials.

As shown in FIG. 7, the conformal formation of channel layer 710 results in channel layer 710 covering exposed walls of fins 310 after the selective trim. For example, channel layer 710 may cover sidewalls of fins 310. Channel layer 710 may also cover portions of bottom surfaces of wide portions of fins 310. Channel layer 710 may also cover exposed top surfaces of wide portions of fins 310 and the complete top of fins 310. That is, in embodiments in which second semiconductor material portions 306 are not significantly etched during the selective trim, channel layer 710 may cover sidewalls of both first semiconductor material portions 304 and second semiconductor material portions 306, portions of top and bottom surfaces of second semiconductor material portions 306, and the top-surface of the upper-most portion of fins 310. In addition, in some embodiments, channel layer 710 may cover a top surface of base portions 320. Moreover, in some embodiments, channel layer 710 may cover at least a portion of a top surface of at least one of first semiconductor portions 304, when the top surface of the at least one of first semiconductor material portions 304 extends in a direction away from the sidewall of the one or more narrow portions. Alternatively, or additionally, channel layer 710 may completely cover the top surface of the at least one of the plurality of first semiconductor portions 304.

Channel layer 710 may be formed with different regions and include at least three different regions arranged in a substantially horizontal direction that is substantially parallel with the surface of substrate 102. For example, channel layer 710 may define different regions that are arranged parallel to substrate 102 and perpendicular to fins 310. The regions of channel layer 710 in this direction may include a drain region having a doping concentration to form the finFET drain, a source having the doping concentration to form the finFET source, and a channel region in contact with both the drain region and the source region. With this arrangement, when a voltage is applied on drain and source regions of channel layer 710, an electric current would flow substantially parallel to the surface of substrate 102 using channel layer 710 as the channel material.

Figure 8:
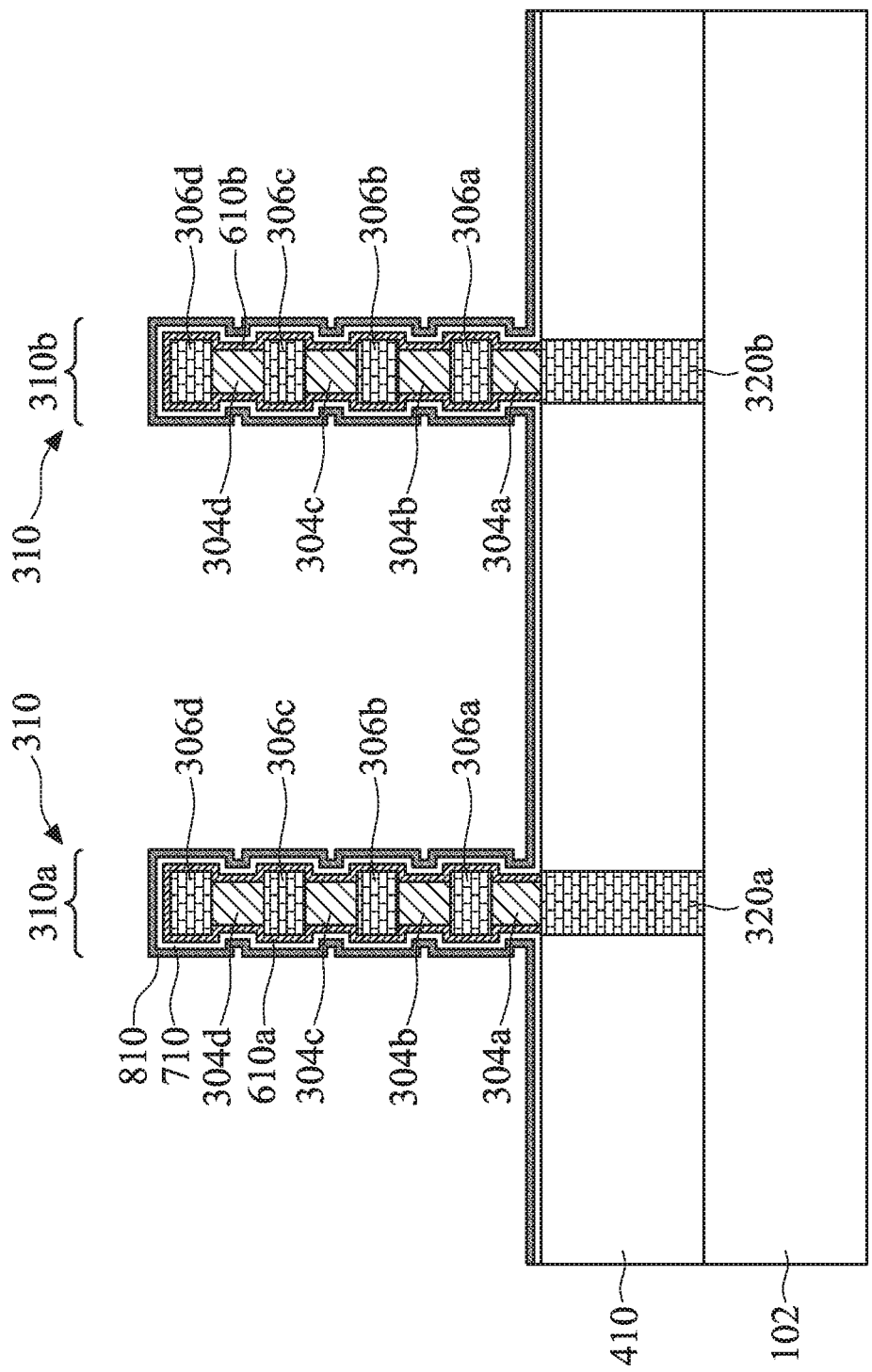

Subsequently, in preparation for patterning channel layer 710, an insulating layer 810 may be formed to cover channel layer 710. As shown in FIG. 8, insulating layer 810 may be formed conformally over walls of fins 310 and over STI regions 410. Thus, insulating layer 810 may be formed as a conformal blanket layer over fins 310 and exposed STI regions 410. Insulating layer 810 may include one or more layers of insulating materials such as silicon oxide based material, including silicon dioxide ($SiO_2$) and/or SiON, nitride based materials, including silicon nitride, or combinations thereof. In some embodiments, insulating layer 810 may include one or more layers of dielectric material, such as a high-k oxides, including, for example, high-k dielectrics oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer (not shown) made of, for example, a thin layer of silicon oxide, may be formed over channel layer 710 before forming the insulating layer 810. Insulating layer 810 may be formed by using CVD, PVD, ALD or other suitable film forming methods.

Although not shown in FIG. 8, after depositing insulating layer 810, additional layers may be formed over substrate 102. For example, after forming insulating layer 810, a dummy dielectric layer may be deposited over substrate 102 and, like insulating layer 810, may cover fins 310 and STI regions 410 creating an insulating+dummy layer. In such embodiments, the added dummy dielectric layer may be patterned with CMP and/or photolithography. Moreover, in other embodiments, after depositing insulating layer 810, conductive layers for a metal gate, including work function metal and contact metal, may be formed on top of insulating layer 810 to from an insulating+metal gate layer. In such embodiments, the metal gate layer may also be patterned with CMP, photolithography, and/or etching processes.

Figure 9:
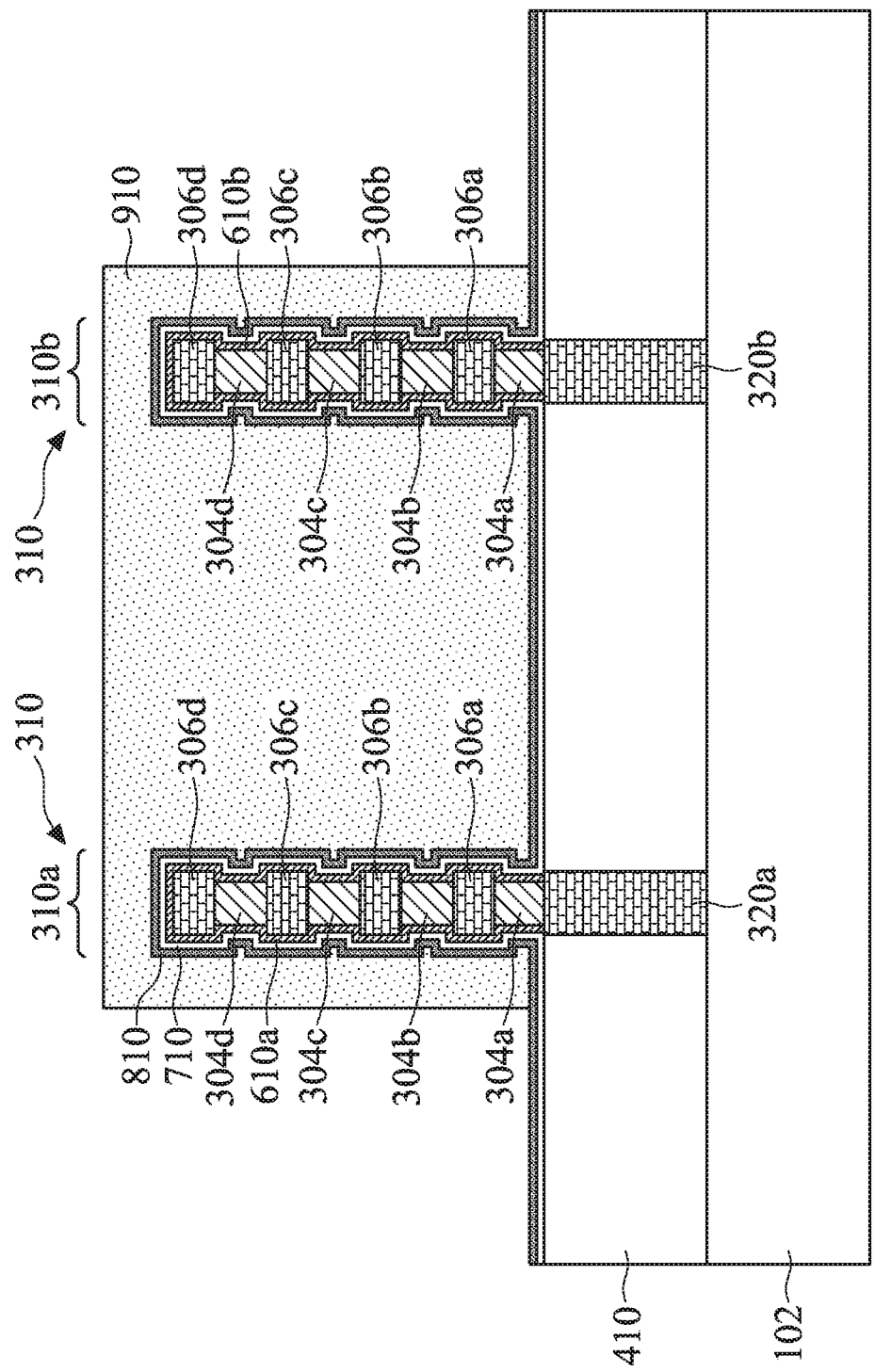

As shown in FIG. 9, in some embodiments a photoresist layer 910 may be formed and patterned to protect insulating layer 810 covering fins 310 and a portion of STI regions 410 connecting pairs of fins 310. In the depicted embodiment, two fins form a single transistor. Thus, the channel layer 710, which will provide the transistor channel, connects two of the fins. In such embodiments, photoresist layer 910 may be formed over insulating layer 810 and patterned to protect fins 310 and STI regions 410 connecting fins 310. In the embodiment of FIG. 8, photoresist layer 910 has been patterned to protect insulating layer 810 over two fins 310, STI regions 410 that connects the two fins 310, and STI regions 410 adjacent to the two fins 310. The photolithography process to pattern photoresist layer 910 may include lithographic processes using UV exposure of photoresist layer 910 through a mask. Alternatively, patterning photoresist layer 910 may include mask-less photolithography, such as electron-beam writing, and ion-beam writing.

Figure 10:
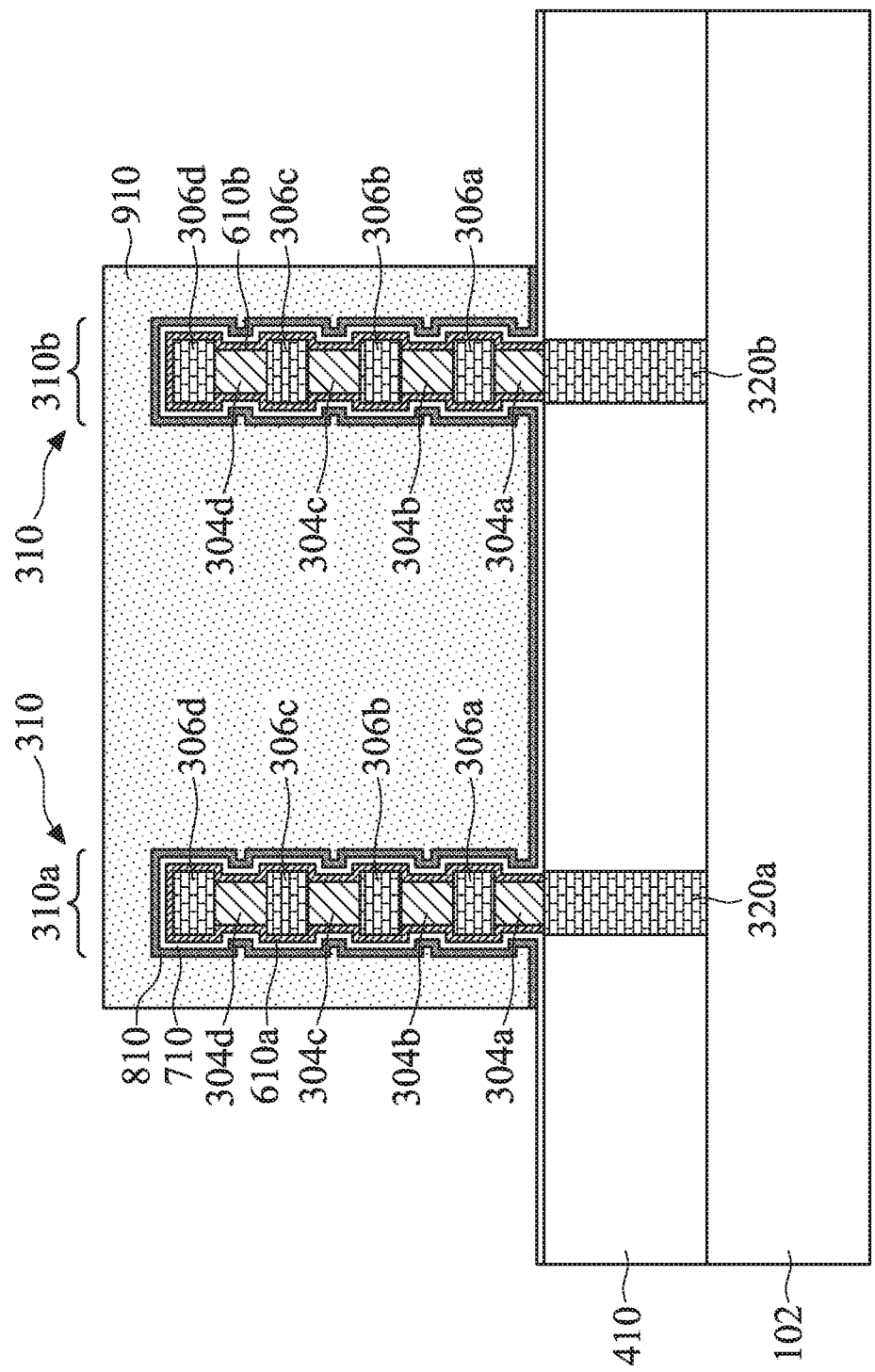

As shown in FIG. 10, areas of insulating layer 810 not protected by the patterned photoresist layer 910 are etched to form a hard mask that protects some regions of channel layer 710. After patterning photoresist layer 910 exposed portions of insulating layer 810 may be etched with an etchant selective to the insulating layer 810. For example, in embodiments in which insulating layer 810 is formed of a silicon oxide, exposed portions of insulating layer 810 may be etched with an etchant that is selective to oxides. Alternatively, in embodiments in which insulating layer 810 is formed of a nitride, exposed portions of insulating layer 810 may be etched with an etchant that is selective to nitrides. Moreover, the etchant selected may be selected so it does not etch or contaminate channel layer 710. Etching insulating layer 810 may include any suitable etching process including dry etching, wet etching, and/or combinations. For example, in some embodiments, insulating layer 810 may be etched in a dry etching process using a fluorine-based etchant. In some embodiments, etching insulating layer 810 may include multiple etching steps with different etching chemistries, recipes, or conditions.

Figure 11:
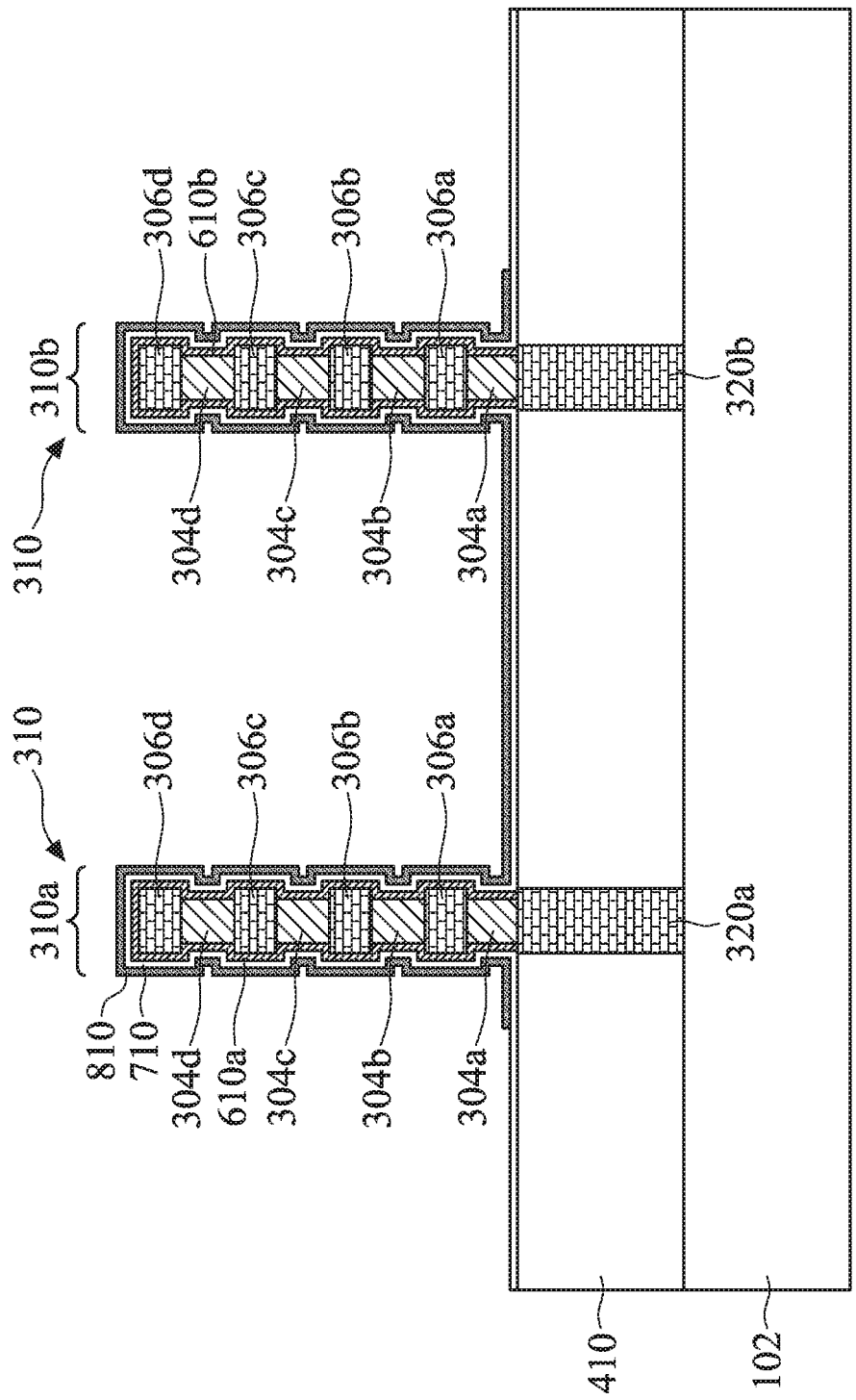

Once exposed regions of the insulating layer 810 are etched, forming a hard-mask on fins 310, in some embodiments it may be desirable to remove remaining portions of photoresist layer 910. For example, if etching of channel layer 710 requires etching at high temperatures or use of gases that may break and dissolve photoresist layer 910, it may be desirable to remove remaining portions of photoresist layer 910 before etching channel layer 710 to prevent polymer contamination. Thus, as shown in FIG. 11, after etching insulating layer 810, remaining portions of patterned photoresist layer 910 may be removed. For example, a photoresist stripper may be applied to substrate 102 to remove photoresist layer 910, leaving insulating layer 810 as a hard mask over fins 310 and portions of STI regions 410. Alternatively, or additionally, remaining portions of photoresist layer 910 may be exposed to an organic solvent that dissolves and removes remaining portions of photoresist layer 910 from over substrate 102. Other methods such as dry etching of photoresist may also be used to remove remaining photoresist layer 910. However, removing photoresist layer 910 may not be required for etching processes of channel layer 710 that can be performed with photoresist on substrate 102.

Figure 12:
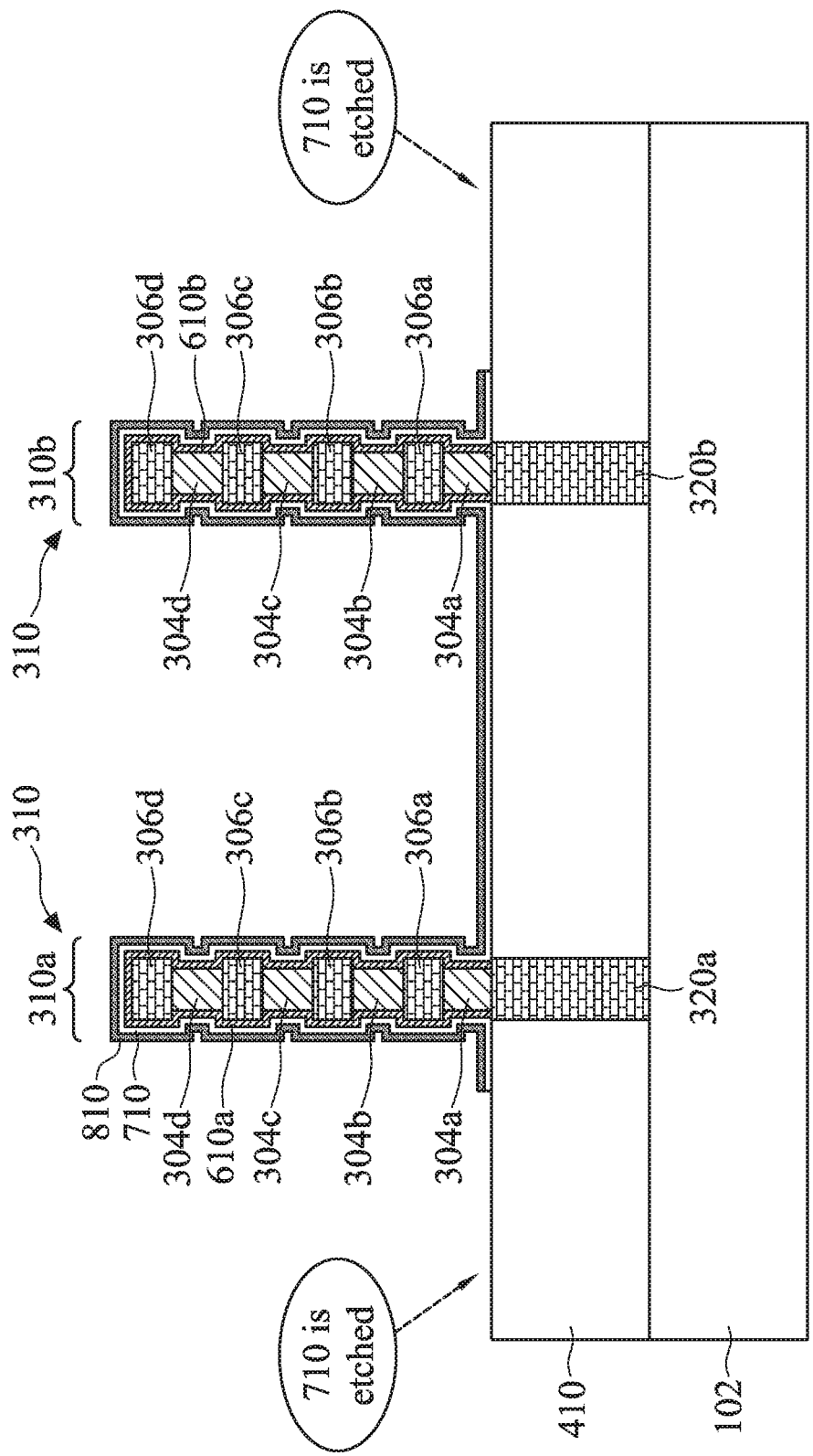

In some embodiments, as shown in FIG. 12, after removing photoresist layer 910 insulating layer 810 may protect certain regions of channel layer 710 but leave other regions exposed. Particularly, portions of channel layer 710 on STI regions 410 not adjacent to fins 310 are exposed. Then, exposed regions of channel layer 710, not protected by the hard-mask formed by insulating layer 810, may be etched to define the finFET active regions. The etching of channel layer 710 may include any suitable etching technique for the selected material of channel layer 710, and in various embodiments, includes wet etching, dry etching, such as reactive ion etching, and/or a combination of etching techniques. For example, in embodiments in which channel layer 710 includes $MoS_2$, etching channel layer 710 includes dry etching using fluoride gases such as $CF_x$, $SF_x$, $XeF_x$, and suitable combinations. Alternatively, or additionally, when channel layer 710 includes graphene, etching channel layer 710 includes oxygen plasma etching. Further, exposed regions of channel layer 710 may be etched applying other gaseous reactants, wet etchants, or etching recipes or conditions.

Figure 13:
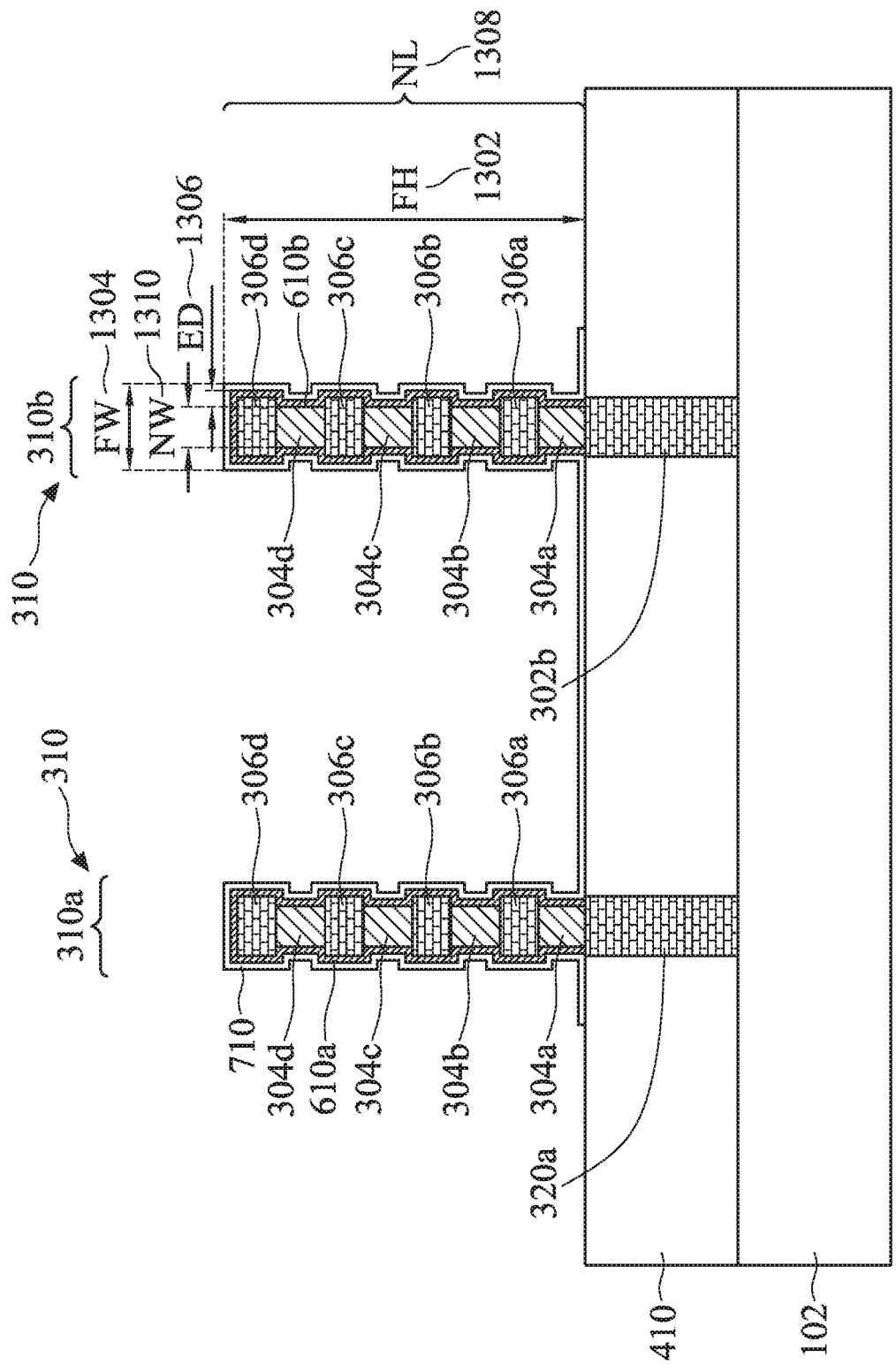

As shown in FIG. 13, after patterning channel layer 710 the hard mask formed by insulating layer 810 may be removed from fins 310 and portions of STI regions 410. For example, in embodiments in which insulating layer 810 is an oxide or nitride layer, an etchant selective to oxides and/or nitrides may be applied to clear remaining portions of insulating layer 810 to leave channel layer 710 as the outer-most layer on fins 310.

Fins 310 shown in FIG. 13 provide a transistor body with thin body channel material that has a higher effective width and current capacity. The 'I' shapes, generated by selectively etching portions of the fin to create wide and narrow portions, provide a larger periphery for the formation of the channel layer 710 on fins 310. The larger periphery of fins 310 may enhance current capacity because the effective width of the channel layer 710 is not constrained by the fin width and height only. For example, without the selective trim the periphery of each one of fins 310 would be P=2*FH+FW, where P is the periphery, FH 1302 is fin height, and FW 1304 is fin width. With the selective trim to generate narrow and wide portions, the periphery of fins 310 is P=2*FH+FW+(2*ED)*NL, where P is the periphery, FH 1302 is fin height, and FW 1304 is fin width (as defined by the wide portions), ED 1306 is the etched differential between wide and narrow portions, and NL 1308 is the number of semiconductor portions. The added periphery (2*ED*NL) may be calculated based on the difference between the etch rates of first semiconductor material portions 304 and second semiconductor material portions 306 and an etchant exposure. For example, if the etch rate of first semiconductors portions 304 exposed to an etchant is 3 nm/min, the etch rate of second semiconductor material portions 306 exposed to the etchant is 1 nm/min, and fins 310 were exposed for 2 mins, ED 1306 would be equal to ED=(3 nm/min−1 nm/min)*2 min=4 nm. Applying this example to the embodiment depicted on FIG. 13, in which NL=8, the added periphery is of 32 nm. This added periphery increases the effective width of channel layer 710, which is conformally formed on fins 310. The greater width may improve the finFET current capacity without increasing the occupied chip area.

Alternatively, instead of estimating the periphery based on different etch rates, the peripheries of fins 310 may be determined based on the difference between wide of the narrow portions after the selective trim. For example, periphery of fins 310 may be determined based on P=2*FH+FW+(FW−NW)*NL, where P is the periphery, FH 1302 is fin height, and FW 1304 is fin width (as defined by the wide portions), NW 1310 is width of narrow portions, and NL 1308 is the number of portions that form fins 310. Therefore, the disclosed semiconductor fin with 'I' shape adds a periphery of (FW−NW)*NL. This increase in periphery may enable accommodation of more of channel layer 710 material and may result in a greater effective transistor width. The added periphery ultimately increases the cross-sectional area of patterned channel layer 710 resulting in a wider active area.

With the 'I' shape shown in FIG. 13, the added periphery to fins 310 by the selective trim process, is of (2*ED*NL) or (FW−NW)*NL, where ED 1306 is the etch different, FW 1304 is the fin width, NW is width of narrow portions, and NL is the number of portions that form fins 310. Therefore, to maximize the added periphery, ED 1306 may be increased, NW 1310 may be minimized, and/or NL 1308 may be increased. However, the selection of this selective trim to narrow NW 1310 and the selection of the number of layers NL 1308 may be constrained by structural reliability. Increasing NL 1308 or ED 1306 by too much while decreasing NW 1310 too much may result in fins that are easily breakable and may reduce yields. Thus, the processes described in connection to FIGS. 1-5 to form fins, may be selected to enhance not only the effective width for finFETs but also their reliability and structural robustness.

FIGS. 14-18 show cross sectional views of an exemplary sequential manufacturing process of a semiconductor device according to another embodiment of the present disclosure. It is understood that additional operations can be provided before, during, and after processes shown by FIGS. 14-18, and some of the operations described below can be replaced or eliminated for additional embodiments of the method. The order of the operations/processes may be interchangeable. Further, the same or similar configurations, structures, materials, operations or processes described relative to the foregoing embodiments may also be employed all or in part relative to this embodiment.

Figure 14:
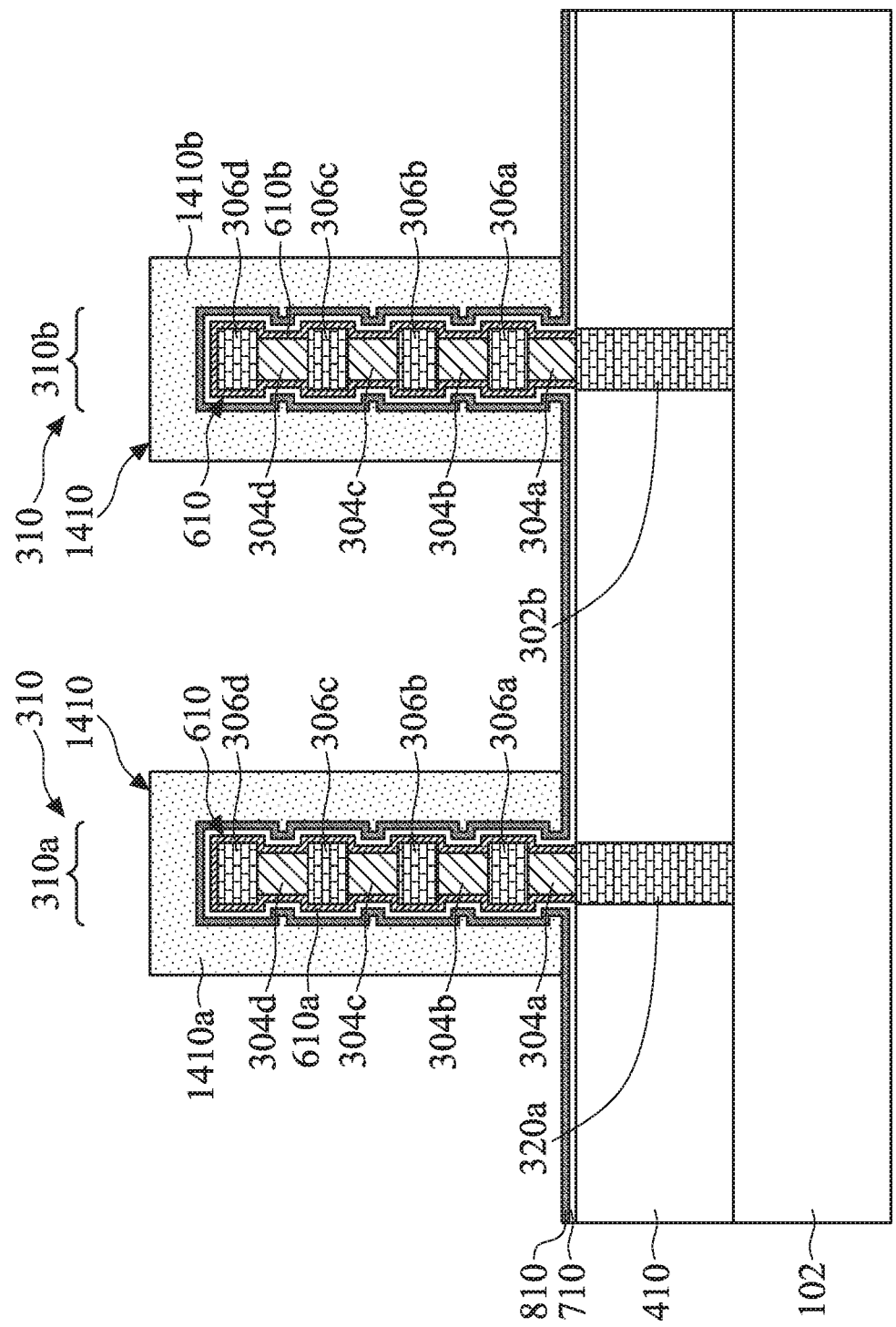
FIGS. 14-18 show cross-section views of an exemplary sequential manufacturing process of a semiconductor device in accordance with embodiments of the present disclosure.

In the embodiment beginning at FIG. 14, after forming insulating layer 810 resulting in a structure similar to what is shown in FIG. 8, a photoresist layer 1410 is pattern to cover each one of fin 310*a* and fin 310*b*. Unlike photoresist layer 910, photoresist layer 1410 may be formed and patterned in two sections 1410*a* and 1410*b* so it covers fins 310 without covering STI regions 410 between fin 310*a* and fin 310*b*. This embodiment may be favored when it is desirable to have independent transistors. For example, this process results in one transistor per semiconductor fin, rather than the coupled transistors resulting from the transistor body shown in FIG. 13. Photolithography of photoresist layer 1410 may require stricter tolerances than the photolithography of photoresist layer 910. Nonetheless, this embodiment may be selected where an increase in device density may be desired.

As shown in FIG. 14, photoresist layer 1410 may be formed and patterned to protect fins 310. For example, photoresist layer 1410 may be formed over insulating layer 810 and patterned to cover fins 310. Similar to photoresist layer 910, photoresist layer 1410 may be patterned using a variety of photolithography processes including both masked and mask-less processes.

Figure 15:
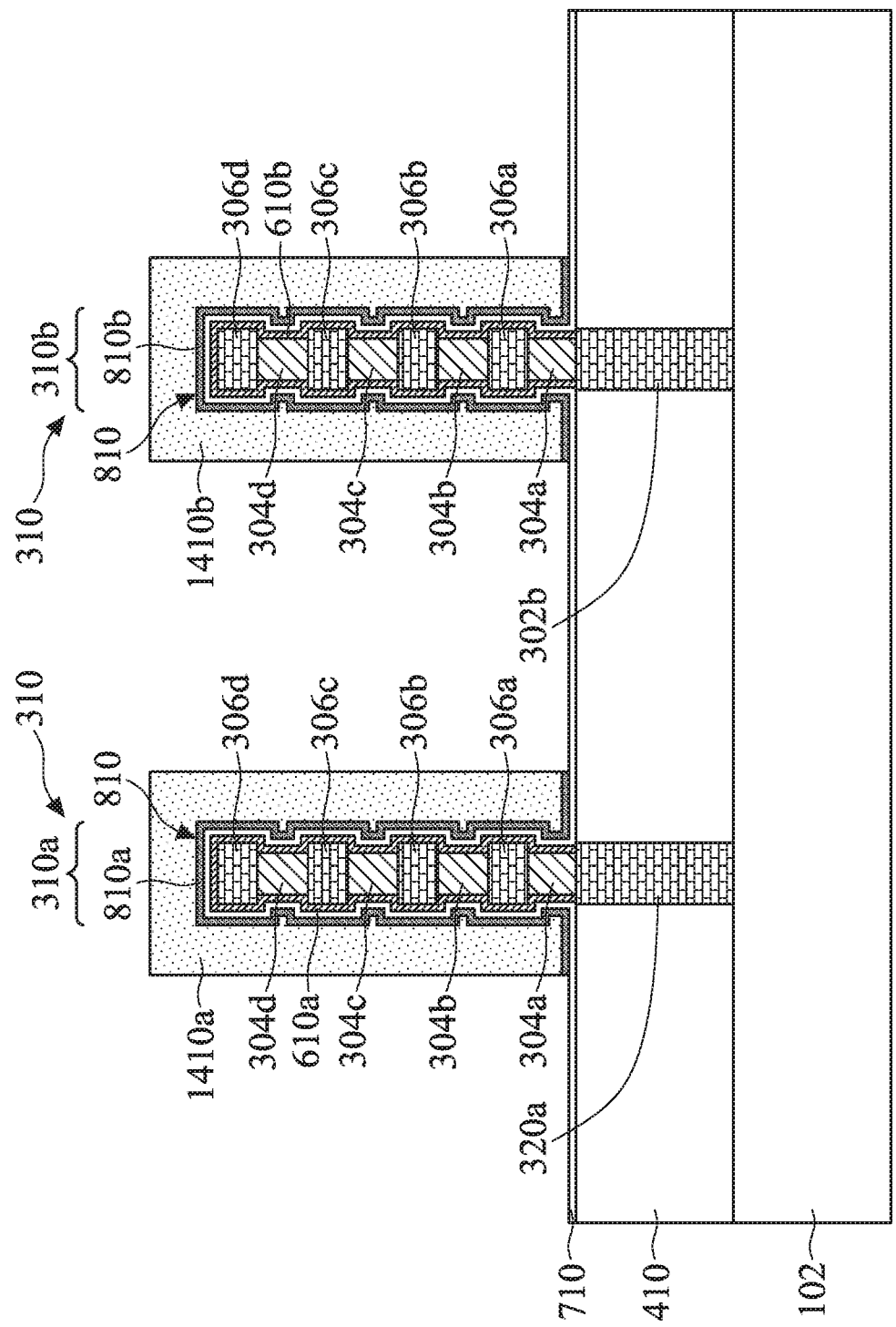
Figure 16:
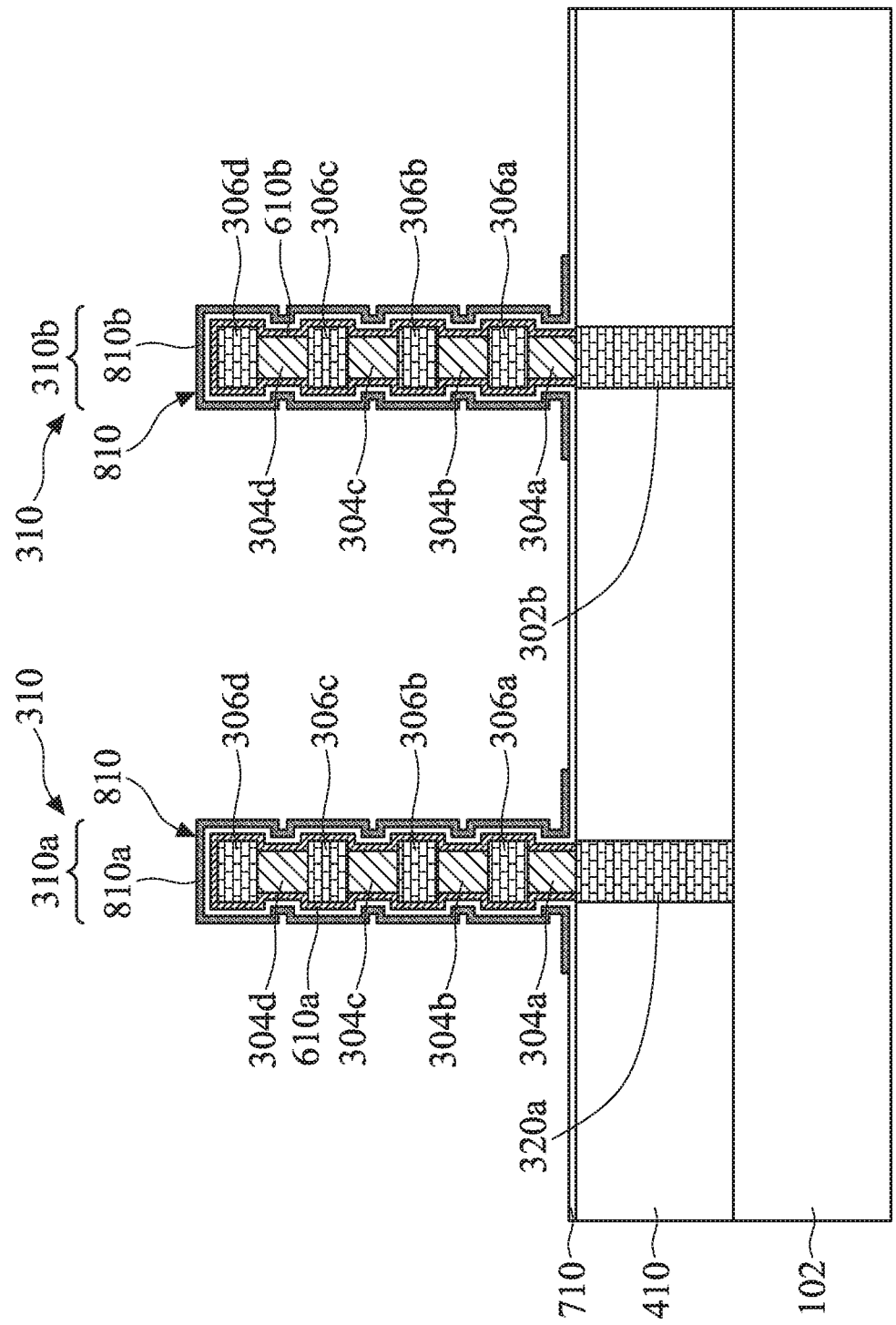

Subsequently, as shown in FIG. 15, areas of insulating layer 810 not protected by the patterned photoresist layer 1410 are etched to form a hard mask that protects channel layer 710 over fins 310. Once exposed regions of the insulating layer 810 are etched, remaining portions of photoresist layer 1410 may be removed in preparation for etching channel layer 710 as shown in FIG. 16. However, in embodiments in which etching of the channel layer 710 is not affected by the presence of photoresist, photoresist layer 1410 may be left on fins for etching the channel layer 710. Moreover, in such embodiments, the hard mask forming process may be circumvented and channel layer 710 may be patterned using the photoresist as the mask.

Figure 17:
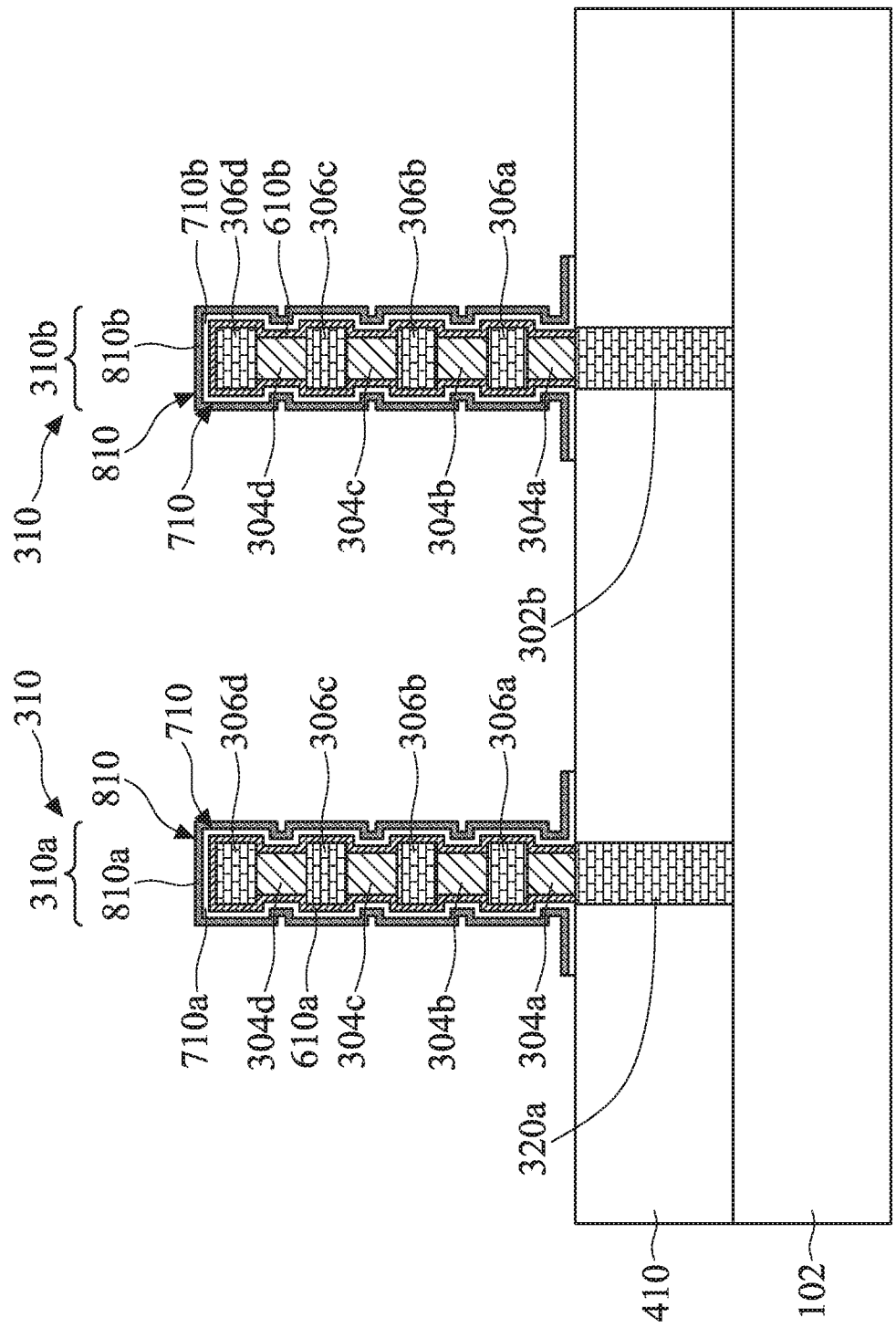
Figure 18:
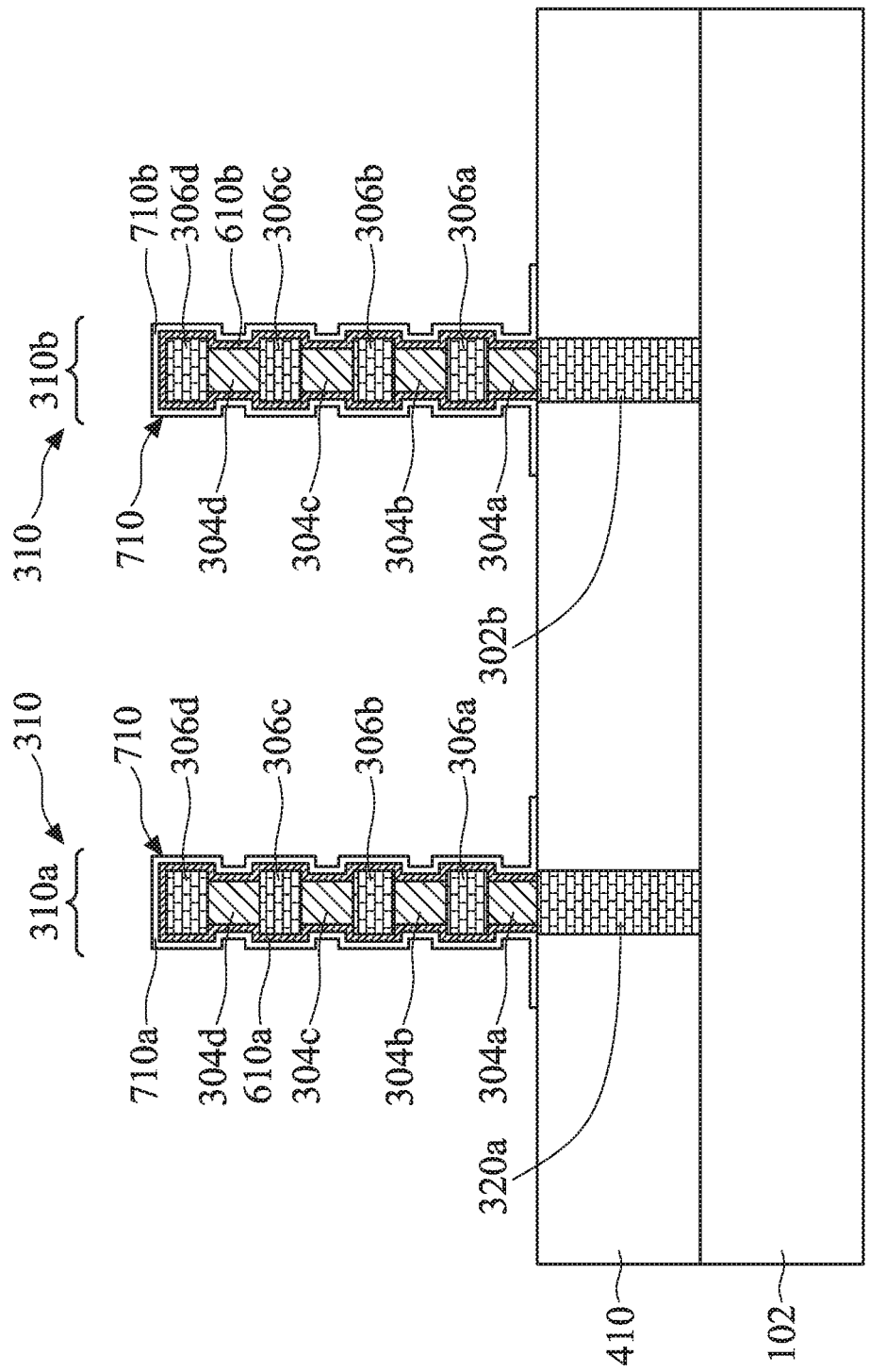

As shown in FIG. 17, exposed regions of channel layer 710, not protected by the hard-mask, may be etched to define active regions. Then, as shown in FIG. 18, remaining portions of insulating layer 810 may be removed from fins 310 using an etching process that is selective to insulating layer 810, leaving channel layer 710 as the outer-most layer on fin 310*a* and on fin 310*b*. Unlike the device of FIG. 13, in which channel layer 710 forms a body channel covering two fins 310, FIG. 18, shows a device with two independent body channels that may be used for two independent transistors. Thus, this embodiment may favor device density over device width. Similar periphery and effective width gains as discussed in connection with FIG. 13 may be achieved with fins 310 of FIG. 18.

Figure 19A:
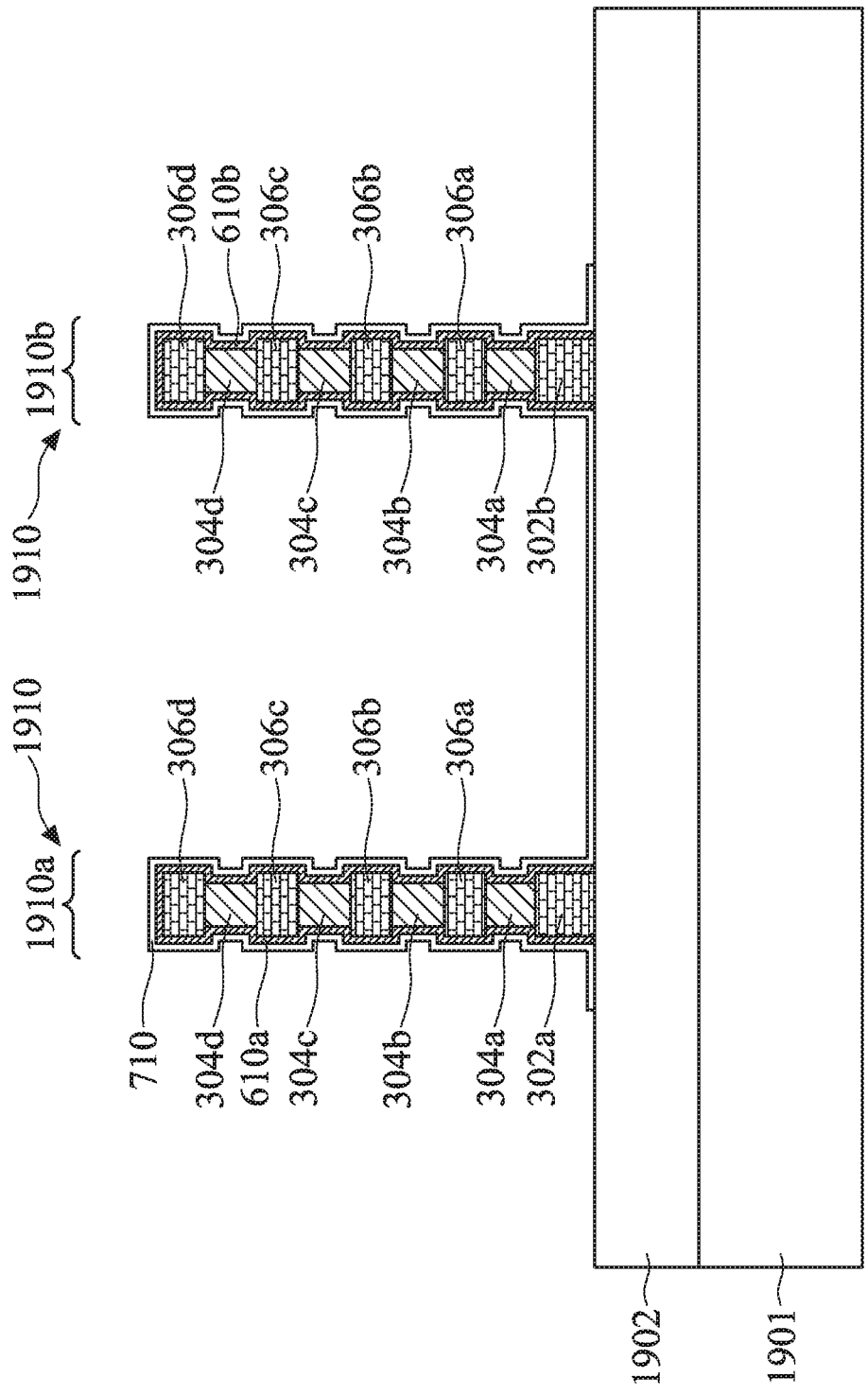
FIGS. 19A-19B show cross-sections of semiconductor devices in accordance with embodiments of the present disclosure.
Figure 19B:
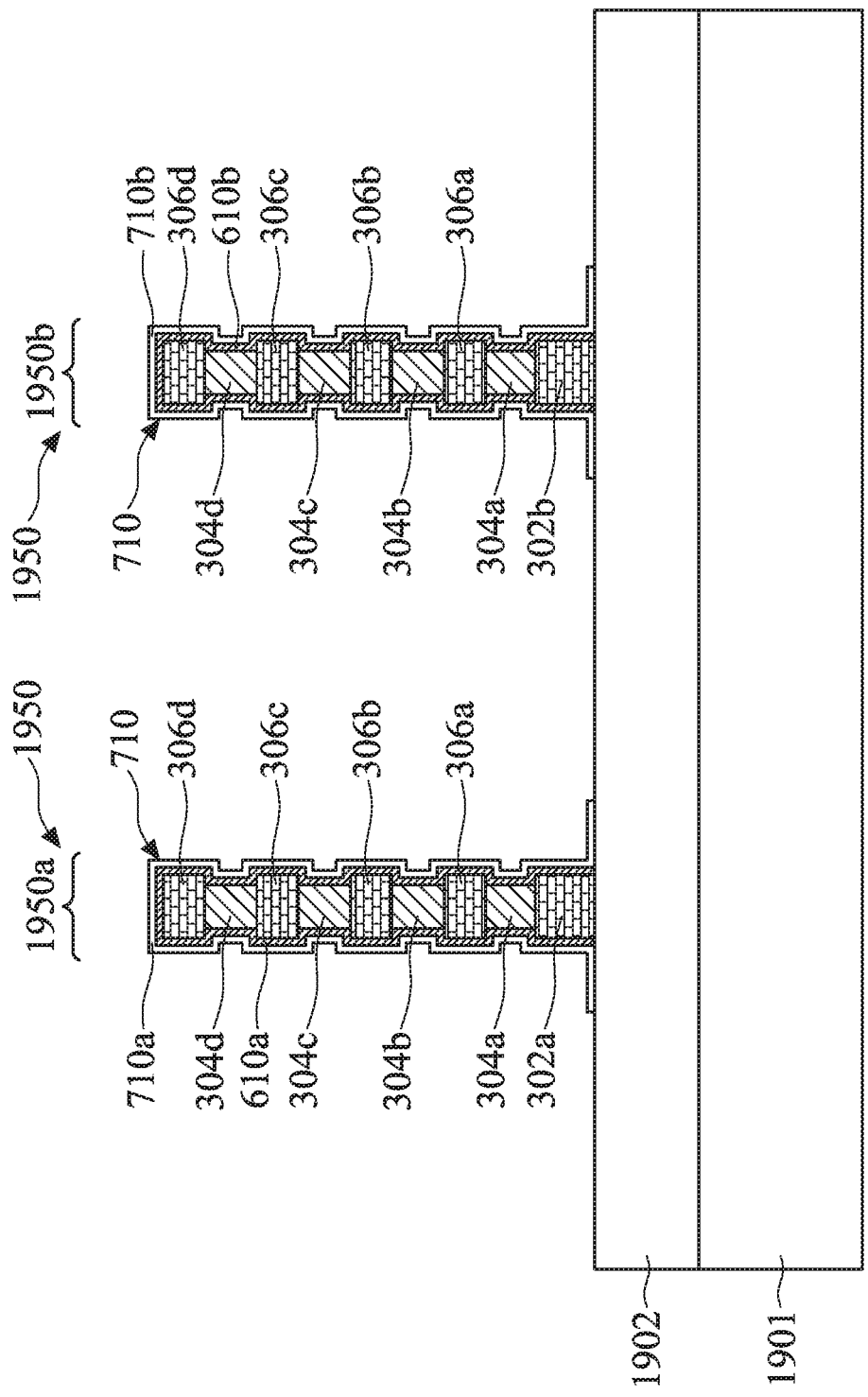

FIGS. 19A-19B show cross-sections of semiconductor devices in accordance to embodiments of the present disclosure, and more particularly of semiconductor fins formed with the processes described in connection to FIGS. 1-18. However, instead of using a bulk substrate 102, the fins shown in FIGS. 19A-19B are formed on silicon on insulator (SOI) substrates and use the full thickness of the SOI device layer as part of the fin and the buried oxide of the SOI as the shallow trench isolation.

FIG. 19A shows a cross-section of a semiconductor fin in accordance with embodiments of the present disclosure. Semiconductor fins 1910 are similar to fins 310 and may be formed with processes similar to those described in connection to FIGS. 1-13. Therefore, fins 1910 may include alternating first semiconductor material portions 304 and second semiconductor material portions 306 with different widths. In addition, like fins 310, fins 1910 are covered with a conformal dielectric layer 610, and a conformal channel layer 710. However, unlike fins 310, fins 1910 do not include base portions 320 and, instead, rest on a buried oxide layer 1902 from an SOI substrate 102.

Fins 1910 may be formed on a silicon on insulator (SOI) substrate 102 that includes a handle layer 1901 and buried oxide layer 1902. In this embodiment, the device layer of the SOI substrate may serve as the first one of second semiconductor portions 304 or base portions 320. Moreover, in this embodiment it may not be necessary to form and etch STI regions 410 as described in connection to FIG. 4, because the buried oxide layer 1902 acts as a shallow trench isolation.

FIG. 19B show a cross-section of a semiconductor fin in accordance with other embodiments of the present disclosure. Semiconductor fins 1950 are similar to fins 310 and may be formed with processes similar to those described with respect to FIGS. 1-8 and 14-18. Fins 1950 include alternating first semiconductor material portions 304 and second semiconductor material portions 306 with different widths and forming 'I' shapes. In addition, like fins 310, fins 1950 are covered with conformal dielectric layer 610, and conformal channel layer 710. However, unlike fins 310, fins 1910 do not include base portions 320 and rest on a buried oxide layer 1902. Moreover, unlike fins 1910, channel layer 710 only covers fins 1950 without covering buried oxide layer 1902 between the fins 1950.

FIGS. 20A-20C show cross-sections of semiconductor devices in accordance with other embodiments of the present disclosure. The illustrated devices, for example, exhibit other exemplary cross sections for semiconductor fins. For example, FIGS. 20A-20C show exemplary semiconductor fins with profiles different from the 'I' shape described above. These fins may be formed using layer formation and etching techniques different from those described above or in addition to those described above.

FIG. 20A shows an exemplary semiconductor fin in which first semiconductor material portions 304 are selectively etched to generate narrow portions and second semiconductor material portions 306 are etched to create a rounded profile. For example, after the selective trim, as described in connection to FIG. 5, fins 310 may be exposed to an etchant selective to second semiconductor material portions 306 only in order to generate a convex or rounded profile. For example, fins 310 may be exposed to one or more of a dry etching process including a biased plasma, an etching process that uses a chlorine-based chemistry, such as such as Cl$_2$, CHCl$_3$, CCl$_4$, and/or BCl$_3$, and/or an isotropic etch by using gases of Cl$_2$ with NF$_3$. Other suitable processes may be used to leave second semiconductor portions with rounded-convex-shape sidewalls. Alternatively, a combination of etching processes may be applied to generate rounded sidewalls in portions of fins 310. With such a profile, the periphery may be increased (over flat sidewalls, for example). Additionally, such a profile may offer the added benefit of facilitating coating with channel layer 710 by minimizing sharp edges that may be difficult to cover.

FIG. 20B shows an exemplary semiconductor fin in which sidewalls of the narrow portions are not uniformly etched, but instead are etched to generate a concave structure. For example, in some embodiments the etchant used for selective trim of first semiconductor material portions 304 to form the narrow portions may etch the narrow portion unevenly and result in concave structures. For example, the etchant used for narrow portions may quickly etch the middle of the narrow portions but have a lower etch rate for portions close to the wide portions. Thus, the middle may be etched at a faster rate than the bottom and top sections of each portion. Alternatively or additionally, the selective etch to trim narrow portions may be performed with a combination of anisotropic wet etchants and surfactants to accelerate etching in the middle portion of the narrow section to generate the concave structures. Moreover, in some embodiments the concave structure of fins 310 shown in FIG. 20B may be achieved by varying the doping profile of the first semiconductor material layers 104 and second semiconductor material layers 106 during their formation so the selective trim result in the concave structures shown in FIG. 20B. For example, a doping profile of first semiconductor material layers 104 may be selected so it is highly concentrated close to the boundaries but has a lower concentration on towards the middle of the layer. In such embodiments, the etchant used for selective trim may have an etch rate that is dependent on the doping concentration. Thus, control of the doping concentration may result in control of the selective etch profile and facilitate the etching of narrow portions in a concave structure. Alternative methods for concave etching of portions may also be applied to during selective trim of fins 310 to generate structures as shown in FIG. 20B.

FIG. 20C shows an exemplary semiconductor fin that includes three semiconductor materials. The fin of FIG. 20C includes third semiconductor portions 308 in addition to the first semiconductor material portions 304 and second semiconductor material portions 306. For example, instead of alternating between first semiconductor material layers 104 and second semiconductor material layers 106 when forming device layers, to form the semiconductor fin of FIG. 20C, three semiconductor layers may be formed on substrate 102. With three materials used to form fins 310, it is possible to use different etchants during selective trims and create different periphery profiles. For example, etching of first semiconductor material portions 304 to form narrow portions may be followed by a second selective etch targeting third semiconductor portions 308. Third semiconductor portions 308 may be etched with an anisotropic etchant that does not affect first semiconductor material portions 304 and second semiconductor material portions 306 and etches third semiconductor layer in a specific orientation. For example, third semiconductor portions 308 may include doped silicon and be etched using KOH, TMAH, and/or other anisotropic etchant, which may provide more etching in one direction over other directions.

As shown in FIG. 20C, some portions of the fins may include sloped sidewalls generating an irregular cross-sectional profile that may be used to increase the periphery of fins. Increasing the periphery may provide more surface to form channel layer 710 to be formed around the fins, and ultimately maximize the transistor effective width.

While first, second, and third portions have been described as semiconductor layers with different etch rates in the above-discussed embodiments, in alternative embodiments the portions may include non-semiconducting materials. For example, third semiconductor portions 308 may be substituted with a non-semiconductor materials, such as oxides, nitrides, or metals. In addition, in some embodiments any of first, second, and third portions forming fins 310 may be substituted with non-semiconductor materials.

Figure 21:
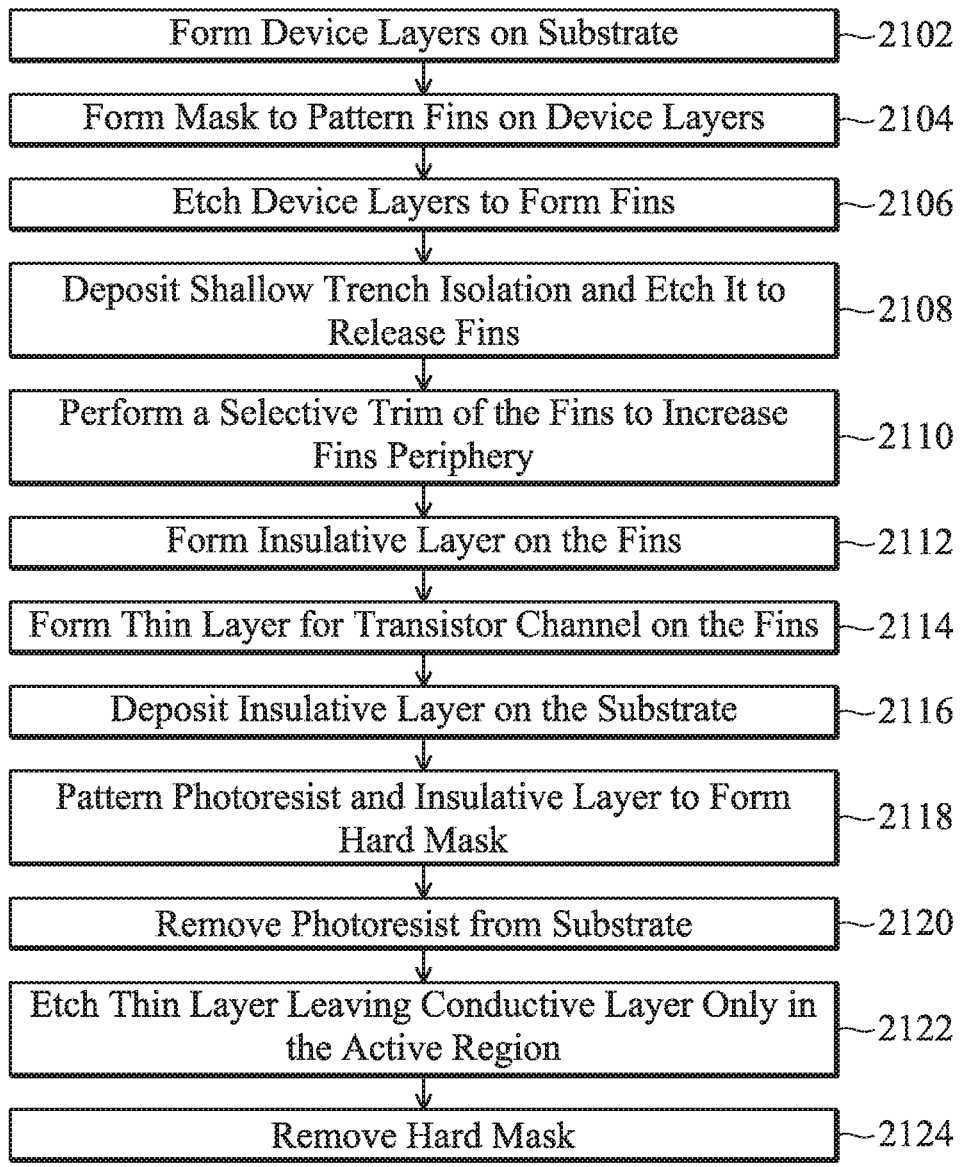
FIG. 21 is an exemplary flow chart of a semiconductor device manufacturing process in accordance with disclosed embodiments.

FIG. 21 is an exemplary flow chart of a semiconductor fin manufacturing process in accordance with one embodiment. Process 2100 describes in a flow chart process steps to form the semiconductor fins described in connection with FIGS. 1-18.

Process 2100 may begin with step 2102, in which device layers are formed on a substrate. In some embodiments, device layers may be formed as alternating layers of different materials that have different etch rates when exposed to an etchant. For example, in step 2102 first semiconductor material layers 104 and second semiconductor material layers 106 may be sequentially formed on substrate 102. First semiconductor material layers 104 and second semiconductor material layers 106 may be selected so they have distinct etch rates when exposed to an etchant.

In some embodiments, more than two layers may form the device layers in step 2102. For example, device layers may include three different layers that are sequentially formed on substrate 102. The three layers may include three semiconductors but may also include a combination of semiconductors with other materials. In such embodiments, each one of the device layers or any group of the device layers may be selected to have a distinct etch rate when exposed to an etchant to facilitate a future selective trim.

In step 2104, a hard mask may be patterned over the device layers to prepare for the anisotropic etch that forms fins on the substrate. For example, mask layer 210 may be formed and patterned on the device layer to form a hard mask that protects device layers in regions that will become the semiconductor fins.

In step 2106, regions of device layers not protected by the hard mask are etched to form semiconductor fins. For example, regions of device layers not protected by mask layer 210 may be etched with an anisotropic etching process, such as deep RIE, to form fins 310. In some embodiments, etching device layers to form fins may include etching, or partially etching, the substrate. For example, when substrate 102 is an SOI substrate, etching device layers may include etching the device layer of the SOI wafer. Alternatively, when substrate 102 is a bulk semiconductor substrate, etching device layers in step 2106 may include partially etching the substrate. Fins resulting from the etching process of step 2106 may include first semiconductor portions 304, corresponding to first semiconductor material layers 104, and second semiconductor material portions 306, corresponding to second semiconductor material layers 106.

In step 2108, a dielectric layer may be formed around and over the formed fins to create shallow trench isolation. For example, a dielectric layer may be formed over substrate 102 and fins 310. The dielectric layer may be planarized with a CMP process and recessed to release fins 310 and form STI regions 410.

Once the fins and surrounding STI is formed, fins may undergo a selective trim process to maximize the periphery of the fins. In step 2110, a selective trim of the fins may be performed to enhance the periphery of fins and ultimately improve the finFET transistor effective width. For example, first semiconductor material portions 304 (or second portions 306 in other embodiments) of fins 310 may be selectively etched to reduce their width. Thus, first semiconductor material portions 304 may form narrow portions while second semiconductor material portions 306 may form wide portions of 'I' shapes that result from the selective etch. Alternatively, other selective etches can be performed to enlarge the periphery of fins. For example, as described in connection with FIGS. 20A-20B, multiple etching steps may be performed to generate concave or convex structures. Alternatively, or additionally, different layers that form the fins may be etched with isotropic and anisotropic etchants to form varied fin contours in step 2110.

In step 2112, an insulative film may be formed on the trimmed fins. For example, dielectric layer 610 formed to cover trimmed fins 310. In some embodiments, forming dielectric layer 610 may include thermal oxidation.

In step 2114, a channel layer may be formed on the complete substrate including fins and STI regions. For example, channel layer 710 may be conformally formed over substrate 102, covering fins 310 and STI regions 410. To pattern channel layer 710, it may be desirable to create a hard mask. Thus, in step 2116 a conformal insulating layer may be deposited over the substrate and fins. For example, insulating layer 810 may be formed to cover channel layer 710, including fins 310 and STI regions 410. The insulating layer is then patterned to form the hard mask in step 2118. A photoresist layer may be formed and patterned, and exposed regions of the underlying insulating layer may be etched away. For example, photoresist layer 910 may be formed and patterned on the substrate to protect regions of the insulating layer 810 that form the hard mask, which may cover fins 310 and portions of the STI regions 410. Alternatively, photoresist layer 1410 may be formed and patterned on the substrate to protect fins 310 only.

In step 2120, after forming the hard mask, it may be desirable to remove remaining portions of the photoresist layer to prepare the substrate for the thin layer etch. For example, remaining portions of photoresist layer 910 and/or remaining portions of photoresist layer 1410 may be stripped in step 2120.

In step 2122, exposed regions of the thin layer, not protected by the hard mask, may be etched to define the active region. For example, regions of channel layer 710 that are not covered by insulating layer 810, are etched to form the active regions of finFETs. Then, the hard mask may be removed to leave the thin layer on top of the fin structures. For example, after channel layer 710 is patterned to define the active regions, the remaining portions of insulating layer 810 that formed the mask may be removed or etched.

After step 2122 other processes to complete finFETs may be performed. For example, because channel layer 710 may be used as the channel of finFET devices, a gate may be formed wrapped around fins 310 and a channel region of channel layer 710. Methods for formation of gates on semiconductor fins such as conformal deposition of high-K dielectrics and depositing gate stacks may be applied to form the transistor's gate. Moreover, contacts to the drain/source regions and the gate stack may be formed to electrically couple the fins 310 and channel layer 710 with other active and passive devices. For example, drain, gate, and source regions may be coupled to an interconnect structure formed on fins 310 that creates contacts and circuits with fins 310 and channel layer 710. The contacts may be formed from any suitable conductor with common examples including copper and tungsten. This arrangement results in a transistor in which current flows from drain to source regions of the channel layer 710 controlled by a gate on the device. That is, such arrangement allows the formation of transistor with ultra-thin body channels formed on patterned semiconductor fins.

In some FETs it may be desirable to increase the current capacity of the devices because greater current capacities may improve device performance and lower power consumption. Increasing current capacity may be achieved, for example, by enlarging the effective width of the transistors. Enlargement of the transistor width, however, is limited by the layout spacing and requirements of device density. Even when transistors are formed using thin body channel materials, such as atomic-layered ultra-thin two-dimensional materials like $MoS_2$ or graphene, the degree to which the transistor width can be enlarged is limited by the available area in the substrate. Three-dimensional transistor designs, such as FinFET devices, provide a greater effective width than planar devices by having an effective three-dimensional width and providing greater channel control. Indeed, when FinFETs are used to support ultra-thin body channels, they provide a multi-dimensional effective width because the width becomes proportional to the fin's periphery. Effective width gains, however, are limited when only the outer periphery of the fins are used to form the channel layer.

The present disclosure includes several exemplary embodiments of a semiconductor fin covered with a thin layer that provides a channel for a finFET transistor with greater effective width. The disclosed selective trimming of fins, for example, provides fins with cross sections having enlarged surface areas and greater peripheries so the channels of the transistors have a larger effective width. Therefore, the disclosed selective trimming of fins can increase transistor width, improves device performance, and enhance current carrying capacity. Moreover, the larger periphery may result in a greater effective width and higher current capabilities without occupying additional area of the substrate. For example, selective trimming of fins 310 results in an 'I' shape cross section that supports transistor channels with a larger effective width without requiring additional area of the substrate (or significant additional areas of the substrate). Other selective trims, as shown in FIG. 20, are also possible to further increase the periphery of fins.

Further, the disclosed embodiments may have good compatibility with state of the art CMOS processes. The materials that form the fins can be formed with standard semiconductor materials, and the disclosed processes and structures are compatible with additional manufacturing steps to form the transistors. For example, the structure and processes to form fins 310 are compatible with the formation of a gate stack, formation of inter layer dielectrics, and/or formation of vias and conductive lines. Further, fins 310 may be formed with standard semiconductor layers such as Si and SiGe that can be formed with standard CMOS equipment. Similarly, channel layer 710 may be formed with ALD and/or CVD processes that employ standard CMOS equipment.

For at least these reasons, the advantages of the disclosed embodiments may result in finFET devices with improved performance and greater device density.

It will be understood that not all advantages have been necessarily discussed herein, no particular advantage is required for all embodiments or examples, and other embodiments or examples may offer different advantages.

According to one aspect of the present disclosure, a FinFET device includes a substrate and at least one semiconductor fin extending from the substrate. The at least one semiconductor fin may include a plurality of wide portions including a first semiconductor material, each of the plurality of wide portions having a first width; one or more narrow portions including a second semiconductor material, wherein each of the one or more narrow portions has a second width less than the first width, and wherein each of the one or more narrow portions separates two of the plurality of wide portions from one another such that the plurality of wide portions and the one or more narrow portions are arranged alternatingly in a substantially vertical direction that is substantially perpendicular with a surface of the substrate. The at least one semiconductor fin may also include a channel layer covering: at least a portion of the sidewalls of the plurality of wide portions and at least a portion of a sidewall of the one or more narrow portions.

According to another aspect of the present disclosure, a semiconductor device includes a substrate and at least one raised fin over the substrate. The at least one raised fin may include: a first portion extending above a surface of the substrate, the first portion having a first width and including a first semiconductor material; a second portion on the first portion, the second portion having a second width and including a second semiconductor material different from the first semiconductor material, and wherein the second width is less than the first width; a third portion on the second portion, the third portion having a third width and including the first semiconductor material, and wherein the third width is greater than the second width. The at least one raised fin may also include a channel layer covering: at least a portion of sidewalls of the second and third portions.

In accordance with yet another aspect of the present disclosure, in a method for fabricating a semiconductor device, device layers are formed on a substrate, the device layers may include alternating first semiconductor layers and second semiconductor layers in a substantially vertical direction that is substantially perpendicular with a surface of the substrate. The device layers may be patterned to form a plurality of fins, each of the plurality of fins extending above a surface of the substrate in a substantially vertical direction that is substantially perpendicular with a surface of the substrate; and a portion of the second semiconductor layers may be etched so that the widths of the second semiconductor layers in at least some of the plurality of fins are narrower than the widths of neighboring first semiconductor layers. Further, a channel layer over the substrate and the plurality of fins may be conformally formed and an isolation layer over the channel layer may be conformally formed. The channel layer may be patterned on the plurality of fins using the isolation layer as a hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A FinFET device comprising:
a substrate;
at least one semiconductor fin extending from the substrate, the at least one semiconductor fin comprising:
    a plurality of wide portions comprising a first semiconductor material, each of the plurality of wide portions having a first width;
    one or more narrow portions comprising a second semiconductor material, wherein each of the one or more narrow portions has a second width less than the first width, and wherein each of the one or more narrow portions separates two of the plurality of wide portions from one another such that the plurality of wide portions and the one or more narrow portions are arranged alternatingly in a substantially vertical direction that is substantially perpendicular with a surface of the substrate; and
a channel layer covering:
    at least a portion of the sidewalls of the plurality of wide portions, and
    at least a portion of a sidewall of the one or more narrow portions.

2. The FinFET device of claim 1, wherein:
the channel layer covers at least a portion of a bottom surface of at least one of the plurality of wide portions, and
the bottom surface of the at least one of the plurality of wide portions extends in a direction away from the sidewall of the one or more narrow portions.

3. The FinFET device of claim 1, wherein:
a thickness ratio between wide portions and narrow portions is selected from the group of 1:2, 1:5, 2:3, 3:5, and 5:7.

4. The FinFET device of claim 1, wherein:
an etch rate ratio between narrow portions and wide portions is between 3:1 and 10:1.

5. The FinFET device of claim 1, wherein a periphery of the at least one semiconductor fin is two times a height of the semiconductor fin, plus a width of the wide portions, plus two times an etch differential times a number of portions in the semiconductor fin.

6. The FinFET device of claim 1, wherein the wide portions comprise a convex or rounded profile.

7. The FinFET device of claim 1, wherein the narrow portions comprise a concave profile.

8. The FinFET device of claim 1, wherein the at least one semiconductor further comprises:
one or more third portions comprising a material different from the first semiconductor material and the second semiconductor material, the one or more third portions comprising sloped sidewalls.

9. The FinFET device of claim 1, wherein:
the plurality of wide portions includes at least three wide portions; and
the one or more narrow portions include at least two narrow portions.

10. The FinFET device of claim 1, wherein
the substrate comprises a silicon on insulator substrate;
the first semiconductor material comprises an elementary semiconductor;
the second semiconductor material comprises a composite semiconductor; and
the channel layer comprises molybdenum disulfate.

11. A semiconductor device comprising:
a substrate;
at least one raised fin over the substrate, the at least one raised fin comprising:
　a first portion extending above a surface of the substrate, the first portion having a first width and comprising a first semiconductor material;
　a second portion on the first portion, the second portion having a second width and comprising a second semiconductor material different from the first semiconductor material, and wherein the second width is less than the first width;
　a third portion on the second portion, the third portion having a third width and comprising the first semiconductor material, and wherein the third width is greater than the second width; and
　a channel layer covering at least a portion of sidewalls of the second and third portions.

12. The device of claim 11, wherein the at least one raised fin further comprises:
a dielectric layer between the first, second, and third portions an the channel layer.

13. The device of claim 12, wherein the dielectric layer comprises thermally grown oxide.

14. The device of claim 12, wherein the dielectric layer thickness is less than one-tenth of the first width.

15. The device of claim 11, wherein the channel layer comprises at least one of:
one or more monolayers of molybdenum disulfate,
one or more graphene layers, or
epitaxially grown layers.

16. The device of claim 11, wherein the channel layer comprises dopants, selected from the group of boron, nitrogen, titanium, chromium, iron, and organic dopants.

17. The device of claim 11, wherein the at least one raised fin further comprises:
a fourth portion on the third portion, the fourth portion having a fourth width and comprising the second semiconductor material, and wherein the fourth width is less than the third width;
a fifth portion on the fourth portion, the fifth portion having a fifth width and comprising the first semiconductor material, and wherein the fifth width is greater than the fourth width;
a sixth portion on the fifth portion, the sixth portion having a sixth width and comprising the second semiconductor material, and wherein the sixth width is less than the fifth width; and
a seventh portion on the sixth portion, the seventh portion having a seventh width and comprising the first semiconductor material, and wherein the seventh width is greater than the sixth width; and wherein
the channel layer further covers:
　at least a portion of sidewalls of the fourth, fifth, sixth, and seventh portions; and
　at least a portion of bottom surfaces of the fifth and seventh portions.

18. The device of claim 17, wherein
the first, third, fifth, and seventh widths are substantially equal;
the second, fourth, and sixth widths are substantially equal;
the first portion has a first height;
the second, fourth, and sixth portions have a second height;
the third, fifth, and seventh portion have a third height; and
the first height is greater than the second and third heights combined.

* * * * *